US010273573B2

(12) United States Patent
Myli et al.

(10) Patent No.: US 10,273,573 B2
(45) Date of Patent: Apr. 30, 2019

(54) METHOD OF COATING BOTH SIDES OF A SUBSTRATE USING A SACRIFICIAL COATING

(71) Applicant: Cardinal CG Company, Eden Prairie, MN (US)

(72) Inventors: Kari B. Myli, Sauk City, WI (US); Gary L. Pfaff, Cazenovia, WI (US); Keith James Burrows, Mineral Point, WI (US); Dylan Schweiss, Middleton, WI (US)

(73) Assignee: CARDINAL CG COMPANY, Eden Prairie, MN (US)

(*) Notice: Subject to any disclaimer, the term of this patent is extended or adjusted under 35 U.S.C. 154(b) by 143 days.

(21) Appl. No.: 15/368,962

(22) Filed: Dec. 5, 2016

(65) Prior Publication Data

US 2017/0167014 A1   Jun. 15, 2017

Related U.S. Application Data

(60) Provisional application No. 62/266,317, filed on Dec. 11, 2015.

(51) Int. Cl.
*C23C 14/35* (2006.01)
*C23C 14/56* (2006.01)
(Continued)

(52) U.S. Cl.
CPC .......... *C23C 14/568* (2013.01); *C03C 17/002* (2013.01); *C23C 14/0676* (2013.01);
(Continued)

(58) Field of Classification Search
CPC ............... C03C 17/00; C03C 2218/33; C03C 2218/355; C03C 2218/365;
(Continued)

(56) References Cited

U.S. PATENT DOCUMENTS 1,256,818 A    2/1918  Nile
2,082,582 A    6/1937  Kling
(Continued)

FOREIGN PATENT DOCUMENTS

DE    4313284 A1   10/1994
EP     369581 A1    5/1990
(Continued)

OTHER PUBLICATIONS

PCT International Search Report and Written Opinion dated Mar. 22, 2017 for related International Application No. PCT/US2016/064905, 11 pgs.

*Primary Examiner* — Rodney G McDonald
(74) *Attorney, Agent, or Firm* — Fredrikson & Byron, P.A.

(57) ABSTRACT

A method of depositing coating onto both sides of a substrate is provided, which includes steps of upwardly sputtering one or more lower targets to deposit a sacrificial coating onto a second surface and downwardly sputtering one or more upper targets to deposit a first functional coating onto a first surface, washing the substrate with one or more washers to remove the sacrificial coating from the second surface while leaving intact the first functional coating on the first surface, and downwardly sputtering the one or more upper targets to deposit a second functional coating onto the second surface.

29 Claims, 21 Drawing Sheets

(51) Int. Cl.
*C23C 14/06* (2006.01)
*C23C 14/08* (2006.01)
*C03C 17/00* (2006.01)

(52) U.S. Cl.
CPC ............ *C23C 14/086* (2013.01); *C23C 14/35* (2013.01); *C23C 14/564* (2013.01); *C03C 2218/33* (2013.01); *C03C 2218/355* (2013.01); *C03C 2218/365* (2013.01)

(58) Field of Classification Search
CPC ... C23C 14/0676; C23C 14/086; C23C 14/35; C23C 14/564; C23C 14/568
USPC ............ 204/192.12, 192.26, 192.27, 192.28
See application file for complete search history.

(56) References Cited

U.S. PATENT DOCUMENTS

| | | |
|---|---|---|
| 2,780,553 A | 2/1957 | Pawlyk |
| 3,852,098 A | 12/1974 | Bloss et al. |
| 3,925,182 A | 12/1975 | Carmichael |
| 3,970,037 A | 7/1976 | Sopko |
| 4,166,018 A | 8/1979 | Chapin |
| 4,212,663 A | 7/1980 | Aslami |
| 4,261,722 A | 4/1981 | Novak et al. |
| 4,336,118 A | 6/1982 | Patten et al. |
| 4,351,861 A | 9/1982 | Henery |
| 4,377,613 A | 3/1983 | Gordon |
| 4,571,350 A | 2/1986 | Parker et al. |
| 4,576,864 A | 3/1986 | Krautter et al. |
| 4,806,220 A | 2/1989 | Finley |
| 4,883,721 A | 11/1989 | Nalepka et al. |
| 4,894,133 A | 1/1990 | Hedgcoth |
| 4,931,158 A | 6/1990 | Bunshah et al. |
| 4,952,430 A | 8/1990 | Bowser et al. |
| 5,020,288 A | 6/1991 | Swensen |
| 5,090,985 A | 2/1992 | Soubeyrand et al. |
| 5,107,643 A | 4/1992 | Swensen |
| 5,302,449 A | 4/1994 | Eby et al. |
| 5,394,269 A | 2/1995 | Takamatsu et al. |
| 5,401,543 A | 3/1995 | O'Neill et al. |
| 5,453,459 A | 9/1995 | Roberts |
| 5,520,996 A | 5/1996 | Balian et al. |
| 5,594,585 A | 1/1997 | Komatsu |
| 5,599,422 A | 2/1997 | Adams, Jr. et al. |
| 5,624,760 A | 4/1997 | Collins et al. |
| 5,626,736 A * | 5/1997 | Florio ................ C25D 5/56 205/125 |
| 5,645,699 A | 7/1997 | Sieck |
| 5,674,658 A | 10/1997 | Burberry et al. |
| 5,683,561 A | 11/1997 | Hollars et al. |
| 5,698,262 A | 12/1997 | Soubeyrand et al. |
| 5,733,660 A | 3/1998 | Makita et al. |
| 5,762,674 A | 6/1998 | Maltby, Jr. et al. |
| 5,849,200 A | 12/1998 | Heller et al. |
| 5,853,866 A | 12/1998 | Watanabe et al. |
| 5,866,199 A | 2/1999 | Swidler et al. |
| 5,866,260 A | 2/1999 | Adams, Jr. et al. |
| 5,874,701 A | 2/1999 | Watanabe et al. |
| 5,939,194 A | 8/1999 | Hashimoto et al. |
| 5,961,843 A | 10/1999 | Hayakawa et al. |
| 5,972,184 A | 10/1999 | Hollars et al. |
| 6,010,602 A | 1/2000 | Arbab et al. |
| 6,013,372 A | 1/2000 | Hayakawa et al. |
| 6,090,489 A | 7/2000 | Hayakawa et al. |
| 6,124,044 A | 9/2000 | Swidler |
| 6,156,171 A | 12/2000 | Hollars et al. |
| 6,165,256 A | 12/2000 | Hayakawa et al. |
| 6,191,062 B1 | 2/2001 | Hayakawa et al. |
| 6,210,779 B1 | 4/2001 | Watanabe et al. |
| 6,379,746 B1 | 4/2002 | Birch et al. |
| 6,660,365 B1 | 12/2003 | Krisko et al. |
| 6,677,063 B2 | 1/2004 | Finley |
| 6,682,773 B2 | 1/2004 | Medwick et al. |
| 6,849,328 B1 | 2/2005 | Medwick et al. |
| 6,921,579 B2 | 7/2005 | O'Shaughnessy et al. |
| 6,964,731 B1 | 11/2005 | Krisko et al. |
| 7,534,466 B2 | 5/2009 | Hartig |
| 8,092,660 B2 | 1/2012 | Myli et al. |
| 8,283,059 B2 | 10/2012 | Hartig |
| 8,658,262 B2 | 2/2014 | Myli et al. |
| 2002/0176988 A1 | 11/2002 | Medwick et al. |
| 2003/0003943 A1 | 1/2003 | Bajikar |
| 2003/0039843 A1 | 2/2003 | Johnson et al. |
| 2003/0059623 A1 | 3/2003 | O'Shaughnessy |
| 2006/0035021 A1* | 2/2006 | Hartig ................ B65G 49/063 427/209 |
| 2009/0053845 A1* | 2/2009 | Wong ..................... B82Y 20/00 438/47 |
| 2012/0125423 A1 | 5/2012 | Krisko |

FOREIGN PATENT DOCUMENTS

| | | |
|---|---|---|
| EP | 637572 A1 | 2/1995 |
| EP | 689096 A1 | 12/1995 |
| EP | 820967 A1 | 1/1998 |
| JP | S57-140339 A | 8/1982 |
| JP | S61-091042 A | 5/1986 |
| JP | S64-014129 A | 1/1989 |
| JP | H11-302038 A | 11/1999 |
| WO | 9715499 A1 | 5/1997 |
| WO | 9737946 A1 | 10/1997 |
| WO | 0037376 A1 | 6/2000 |
| WO | 0037377 A1 | 6/2000 |
| WO | 0050354 A1 | 8/2000 |
| WO | 0102496 A2 | 1/2001 |

* cited by examiner

METHOD OF COATING BOTH SIDES OF A SUBSTRATE USING A SACRIFICIAL COATING

REFERENCE TO RELATED APPLICATION

This application claims priority to U.S. provisional patent application No. 62/266,317, filed Dec. 11, 2015, the entire contents of which are incorporated herein by reference.

FIELD OF THE INVENTION

The invention relates to apparatuses, systems and methods for sputtering thin films onto surfaces. More particularly, the invention relates to sputtering apparatuses, systems and methods that coat both sides of a substrate.

BACKGROUND OF THE INVENTION

It can be difficult to prevent glass and other substrates from accumulating contaminants during the sputtering process. For example, substrates are commonly conveyed across transport rollers as they are coated. During conveyance, the bottom surface of the substrate is in supportive contact with the transport rollers, which can leave minor traces of contact. Sometimes the bottom surface is later coated with a coating. Certain coatings, for example, low-emissivity coatings, can exaggerate the traces of contact, particularly after undergoing heat treatment. Because of this, manufacturers have avoided coating a surface that has been conveyed over transport rollers. It would be desirable to provide an apparatus, system and method that allows for a surface in contact with transport rollers to be later coated with a coating while reducing or eliminating unwanted traces of contact. It would also be desirable to provide an apparatus, system and method that coats two surfaces of a substrate while reducing or eliminating unwanted traces of contact on a surface in contact with transport rollers.

SUMMARY

Figure 1:
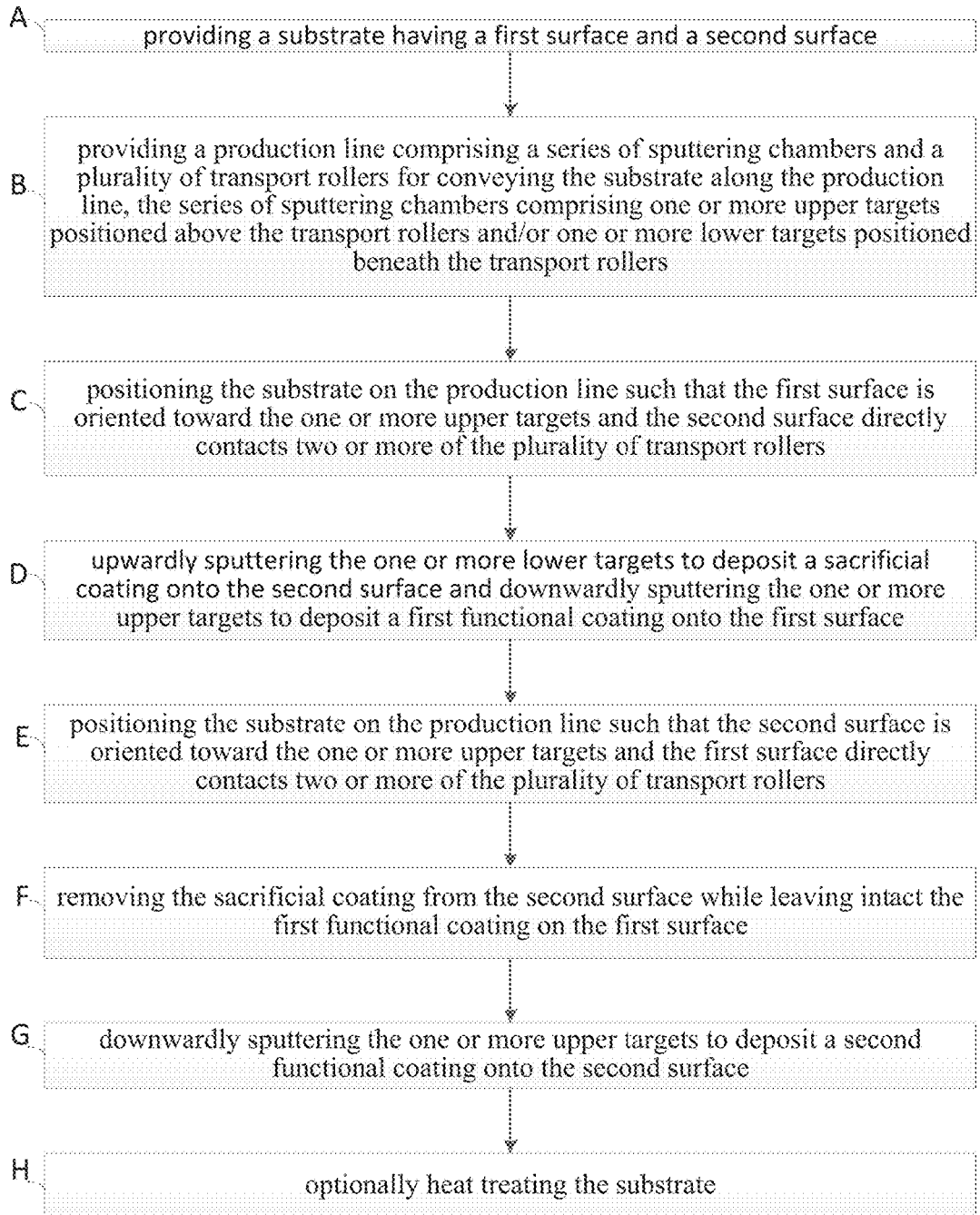
FIG. 1 is a flow chart of a method in accordance with certain embodiments.

A method of depositing coating onto both sides of a substrate is provided, which includes steps of upwardly sputtering one or more lower targets to deposit a sacrificial coating onto a second surface and downwardly sputtering one or more upper targets to deposit a first functional coating onto a first surface, removing the sacrificial coating from the second surface while leaving intact the first functional coating on the first surface, and downwardly sputtering the one or more upper targets to deposit a second functional coating onto the second surface. In some cases, upwardly sputtering said one or more lower targets to deposit a sacrificial coating onto the second surface occurs before the downwardly sputtering said one or more upper targets to deposit a first functional coating onto the first surface.

In some cases, the sacrificial coating has a thickness of less than 150 angstroms and the first functional coating has a thickness of at least 500 angstroms. Also, in some cases, the sacrificial coating consists of a single oxide film and the first functional coating consists of two or more layers each comprising oxide film, nitride film or oxynitride film. In yet other cases, the first functional coating comprises a transparent conductive oxide coating, and the second functional coating is a low-emissivity coating comprising one or more silver layers. In certain cases, the sacrificial coating is a single layer comprising zinc oxide, for example a single layer consisting essentially of pure zinc oxide.

Further, in some cases, the sacrificial coating is removed from the second surface while not functionally altering the first functional coating. In certain cases, the sacrificial coating is removed while not removing more than 10% (e.g., not removing more than 5%, 4%, 3%, 2% or 1%) of the thickness of the first functional coating. In other cases, the first functional coating comprises a transparent conductive oxide coating, wherein the transparent conductive oxide coating includes a transparent conductive oxide and an outer dielectric film, and wherein the sacrificial coating is removed while not removing any thickness of the transparent conductive oxide film.

Also, in other cases, the first functional coating provides the substrate with a surface roughness and the sacrificial coating is removed without changing (e.g., without increasing) the surface roughness by more than 10% (e.g., by more than 5%, 4%, 3%, 2% or 1%). In other yet other cases, the first functional coating provides the substrate with a sheet resistance and the sacrificial coating is removed without changing (e.g., without increasing) the sheet resistance by more than 10% (e.g., by more than 5%, 4%, 3%, 2% or 1%). In still further cases, the first functional coating provides the substrate with a monolithic visible transmittance and the sacrificial coating is removed without changing (e.g., without decreasing) the monolithic visible transmittance by more than 10% (e.g., by more than 5%, 4%, 3%, 2% or 1%). In even further cases, the first functional coating provides the substrate with a haze level and the sacrificial coating is removed without changing (e.g., without increasing) the haze level by more than 10% (e.g., by more than 5%, 4%, 3%, 2% or 1%).

Throughout the specification, whenever the term "comprising," "comprises," "including" or "includes" occurs, that term can be alternately replaced with any of the terms "consisting essentially of," "consists essentially of," "consisting of," or "consisting essentially of."

DETAILED DESCRIPTION

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

The invention includes apparatuses, systems and methods of sputtering coating onto both a first surface and a second surface of a substrate according to certain embodiments. The methods employ the use of a sacrificial coating that is both deposited and removed during the sputter method. The sacrificial coating is deposited directly on a substrate surface in contact with transport rollers to protect the surface from receiving unwanted traces of contact. The sacrificial coating remains on the surface while an opposite surface is coated with a functional coating. Once the opposite surface is coated, the substrate moves through a removing station that includes a system that removes the sacrificial coating while leaving intact the first functional coating. Once the sacrificial coating is removed, the substrate surface is once again exposed. The exposed surface is then coated with another functional coating. The disclosed apparatuses, systems and methods allow for coating two surfaces of a substrate without leaving unwanted traces of contact on the surface in contact with transport rollers.

One embodiment of a method is illustrated by the flow chart shown in FIG. 1. As shown, the method can include sequential steps of (A) providing a substrate having a first surface and a second surface, (B) providing a production line comprising a series of sputtering chambers and a plurality of transport rollers for conveying the substrate along the production line, the series of sputtering chambers comprising one or more upper targets positioned above the transport rollers and/or one or more lower targets positioned beneath and/or between the transport rollers, (C) positioning the substrate on the production line such that the first surface is oriented toward the one or more upper targets and the second surface directly contacts two or more of the plurality of transport rollers, (D) upwardly sputtering the one or more lower targets to deposit a sacrificial coating onto the second surface and downwardly sputtering the one or more upper targets to deposit a first functional coating onto the first surface, (E) positioning the substrate on the production line such that the second surface is oriented toward the one or more upper targets and the first surface directly contacts two or more of the plurality of transport rollers, (F) removing the sacrificial coating from the second surface while leaving intact the first functional coating on the first surface, and (G) downwardly sputtering the one or more upper targets to deposit a second functional coating onto the second surface. In some cases, the method further includes (H) heat treating the substrate. In some cases, the heat treating can occur after downwardly sputtering the one or more upper targets to deposit a second functional coating onto the second surface. In other cases, the heat treating can occur after washing the substrate with the one or more washers to remove the sacrificial coating from the second surface and before downwardly sputtering said one or more upper targets to deposit a second functional coating onto the second surface.

Figure 2:
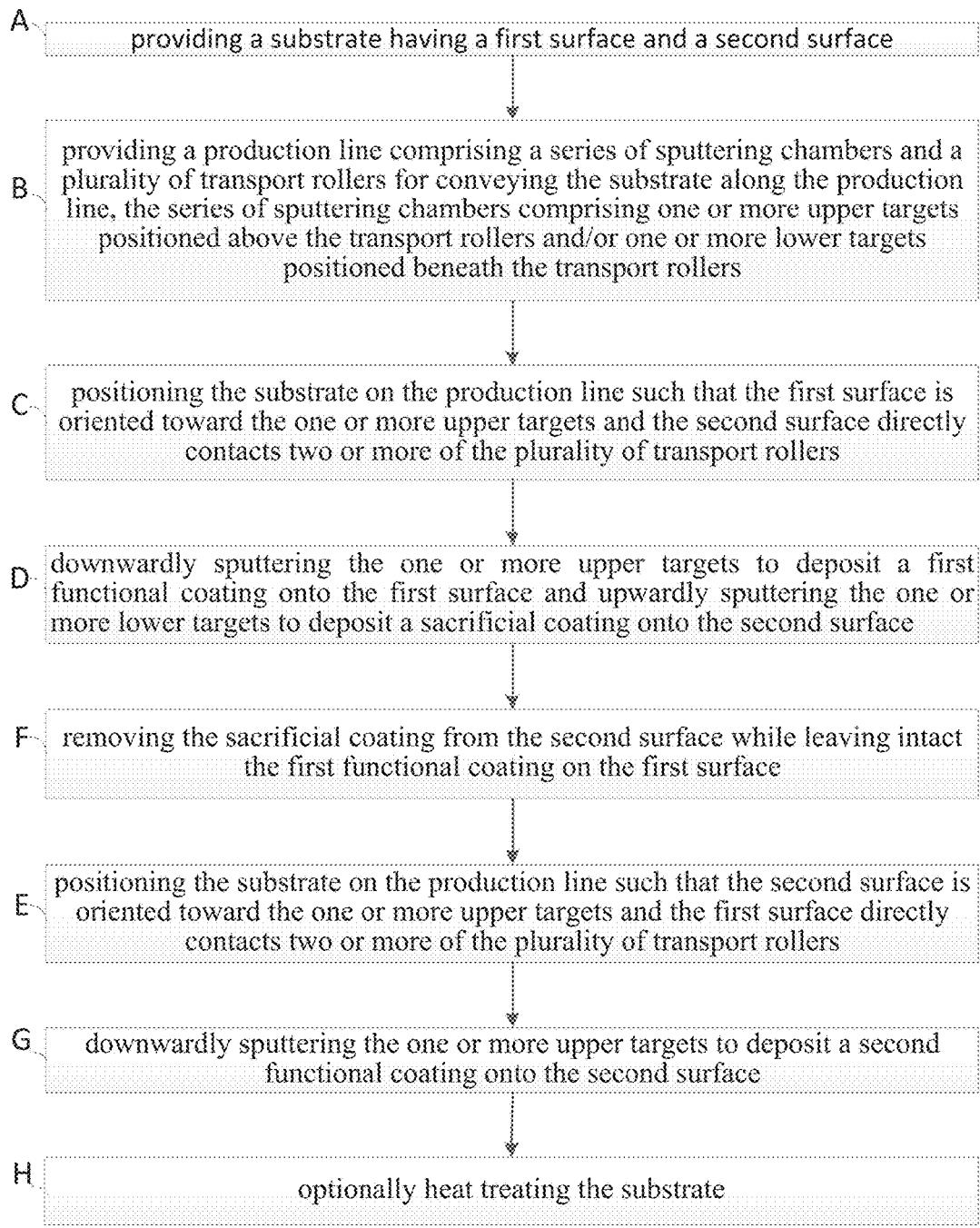
FIG. 2 is a flow chart of another method in accordance with certain embodiments.

In other embodiments, the step (E) of positioning the substrate on the production line such that the second surface is oriented toward the one or more upper targets and the first surface directly contacts two or more of the plurality of transport rollers occurs after the step (F) of removing the sacrificial coating from the second surface while leaving intact the first functional coating on the first surface. Thus, another embodiment of a method is illustrated in the flow chart shown in FIG. 2. As shown, the method can include sequential steps of (A) providing a substrate having a first surface and a second surface, (B) providing a production line comprising a series of sputtering chambers and a plurality of transport rollers for conveying the substrate along the production line, the series of sputtering chambers comprising one or more upper targets positioned above the transport rollers and/or one or more lower targets positioned beneath the transport rollers, (C) positioning the substrate on the production line such that the first surface is oriented toward the one or more upper targets (e.g., the first surface faces upwardly toward the one or more upper targets) and the second surface directly contacts two or more of the plurality of transport rollers (e.g., the second surface faces downwardly and directly contacts two or more of the plurality of transport rollers), (D) downwardly sputtering the one or more upper targets to deposit a first functional coating onto the first surface and upwardly sputtering the one or more lower targets to deposit a sacrificial coating onto the second surface, (F) removing the sacrificial coating from the second surface while leaving intact the first functional coating on the first surface, (E) positioning the substrate on the production line such that the second surface is oriented toward the one or more upper targets and the first surface directly contacts two or more of the plurality of transport rollers, and (G) downwardly sputtering the one or more upper targets to deposit a second functional coating onto the second surface. In some cases, the method further includes (H) heat treating the substrate.

Figure 3:
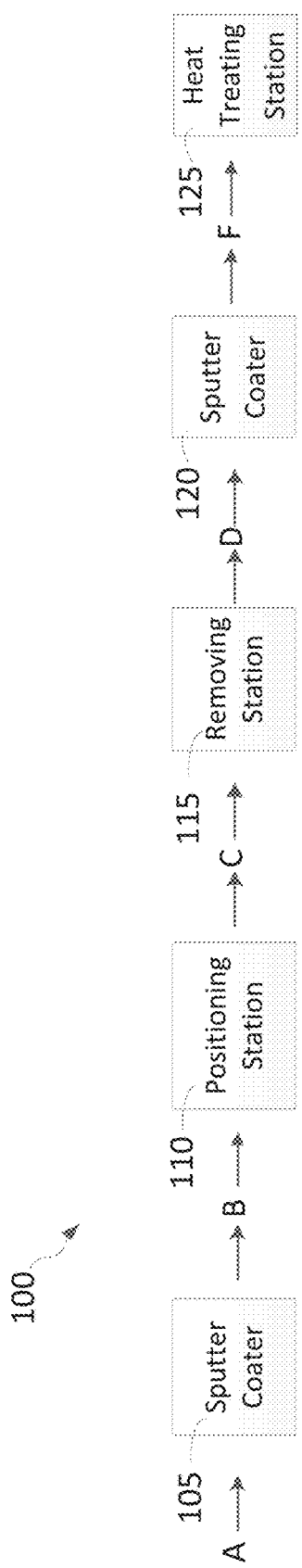
FIG. 3 is a schematic illustration of a production line for use in accordance with certain embodiments.
Figure 4:
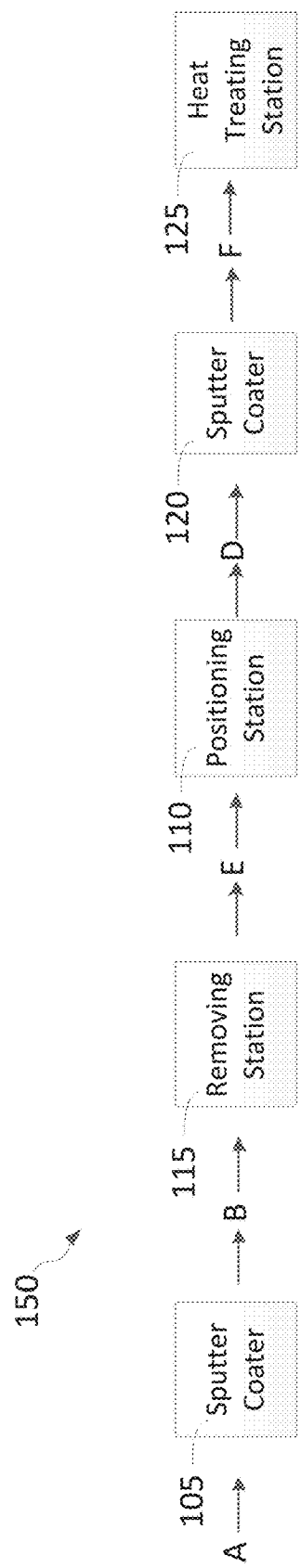
FIG. 4 is a schematic illustration of another production line for use in accordance with certain embodiments.

FIG. 3 illustrates a production line 100 that can be used to perform the methods. The production line 100 includes, in sequential order, a sputter coater 105, a positioning station 110, a removing station 115, a sputter coater 120 and an optional heat treating station 125. FIG. 4 illustrates another production line 150 that can be used to perform the methods. The production line 150 includes, in sequential order, a sputter coater 105, a removing station 115, a positioning station 110, a sputter coater 120 and an optional heat treating station 125. The production line 150 is similar to the production line 100 except that the removing station 115 is provided before the positioning station 110. Each production line 100, 150 also includes a plurality of transport rollers that convey the substrate through the line.

The production lines 100, 150 can each be a single continuous production line or broken up into separate sections. In some cases, the production lines 100, 150 operate as a single continuous line that processes a substrate in a single run. In other cases, the production lines 100, 150 are broken up into separate spaced apart sections, wherein each section processes the substrate in separate runs. For example, in some cases, the production lines 100, 150 can each include a first section separated and spaced from a second section. Each of the first section and the second section can include any combination of components from the production lines 100, 150. In some cases, the first section can include at least the sputter coater 105 and the second section can at least include the sputter coater 120. In other cases, the production line includes a first section that includes any combination of components that deposit both the sacrificial coating and the first functional coating and the second section includes any combination of components that deposit the second functional coating. Also, each section can include a plurality of transport rollers. Once a substrate moves through the first section, it is removed from an end region of the first section. It can then be stacked or stored before being moved to a front region of the second section.

A wide variety of substrate types are suitable for use in the invention. In some embodiments, the substrate 10 is a sheet-like substrate having generally opposed first 12 and second 14 major surfaces. For example, the substrate can be a sheet of transparent material (i.e., a transparent sheet). The substrate, however, is not required to be a sheet, nor is it required to be transparent.

The substrate can optionally become a component of any of a variety of building materials. Examples of anticipated applications include embodiments wherein the substrate is a sash (e.g., a window sash or a door sash), a siding panel (e.g., an aluminum siding panel), a tent panel, a tarpaulin (e.g., a fluorocarbon polymer tarpaulin), a plastic film (e.g., a fluorocarbon plastic film), a roofing shingle, a window blind (such as a metal, plastic, or paper window blind), a paper screen (e.g., a shoji), a railing, a baluster, or an escutcheon. In one embodiment, the substrate is a ceramic tile, such as a wall, ceiling, or floor tile. In another embodiment, the substrate is a glass block. A variety of suitable glass blocks can be obtained commercially from Saint-Gobain Oberland (Koblenz, Germany). In still other embodiments, the substrate is a polyester film, a polyethylene film, a terephthalate film, etc. Suitable films of this nature can be obtained commercially from Nippon Soda Co., Ltd. (Tokyo, Japan). In further embodiments, the substrate is a fence or wall, such as a noise-reduction fence or wall. The substrate can alternatively be part of a photovoltaic device (e.g., it can be a cover for a photovoltaic device).

For many applications, the substrate will comprise a transparent (or at least translucent) material, such as glass or clear plastic. For example, the substrate is a glass sheet (e.g., a window pane) in certain embodiments. Substrates of various sizes can be used in the present invention. Commonly, large-area substrates are used. Certain embodiments involve a substrate 10 having a major dimension (e.g., a length or width) of at least about 0.5 meter, preferably at least about 1 meter, perhaps more preferably at least about 1.5 meters (e.g., between about 2 meters and about 4 meters), and in some cases at least about 3 meters. In some embodiments, the substrate is a jumbo glass sheet having a length and/or width that is between about 3 meters and about 10 meters, e.g., a glass sheet having a width of about 3.5 meters and a length of about 6.5 meters. Substrates having a length and/or width of greater than about 10 meters are also anticipated.

In some embodiments, the substrate 10 is a generally square or rectangular glass sheet. The substrate in these embodiments can have any of the dimensions described in the preceding paragraph and/or in the following paragraph. In one particular embodiment, the substrate is a generally rectangular glass sheet having a width of between about 2 meters and about 4 meters, such as about 2.5 meters, and a length of between about 1.5 meters and about 4 meters, such as about 3.5 meters.

Substrates of various thicknesses can be used in the present invention. In some embodiments, the substrate 10 (which can optionally be a glass sheet) has a thickness of about 1-5 mm. Certain embodiments involve a substrate 10 with a thickness of between about 2.3 mm and about 4.8 mm, and perhaps more preferably between about 2.5 mm and about 4.8 mm. In one particular embodiment, a sheet of glass (e.g., soda-lime glass) with a thickness of about 3 mm is used. In one group of embodiments, the thickness of the substrate is between about 4 mm and about 20 mm. Thicknesses in this range, for example, may be useful for aquarium tanks (in which case, the substrate can optionally be glass or acrylic). When the substrate is float glass, it will commonly have a thickness of between about 2 mm and about 19 mm. In another group of embodiments, the substrate is a thin sheet having a thickness of between about 0.35 mm and about 1.9 mm. Embodiments of this nature can optionally involve the substrate 10 being a sheet of display glass or the like.

The sputter coater 105 is configured to deposit a sacrificial coating onto the second surface 14 and a first functional coating onto the first surface 12. The sputter coater 105 includes one or more sputtering chambers, such as a series of sputtering chambers. Magnetron sputtering chambers are well known in the art and are commercially available from a variety of sources. While a thorough discussion of such magnetron sputtering chambers is beyond the scope of the present disclosure, one relatively useful structure for such a device is disclosed in U.S. Pat. No. 5,645,699 (Sieck), the teachings of which are incorporated herein by reference.

The one or more sputtering chambers of coater 105 include one or more upper targets positioned above the plurality of transport rollers and/or one or more lower targets positioned beneath and/or between the plurality of transport rollers. The one or more lower targets are configured to upwardly sputter a sacrificial coating onto the second surface 14 and the one or more upper targets are configured to downwardly sputter a first functional coating onto the first surface 12. In some cases, the one or more lower targets are configured to upwardly sputter a sacrificial coating onto the second surface 14 before the one or more upper targets are configured to downwardly sputter a first functional coating onto the first surface 12. Also, in some cases, the one or more lower targets sputter material upwardly between at least two of the plurality of transport rollers.

Figure 11:
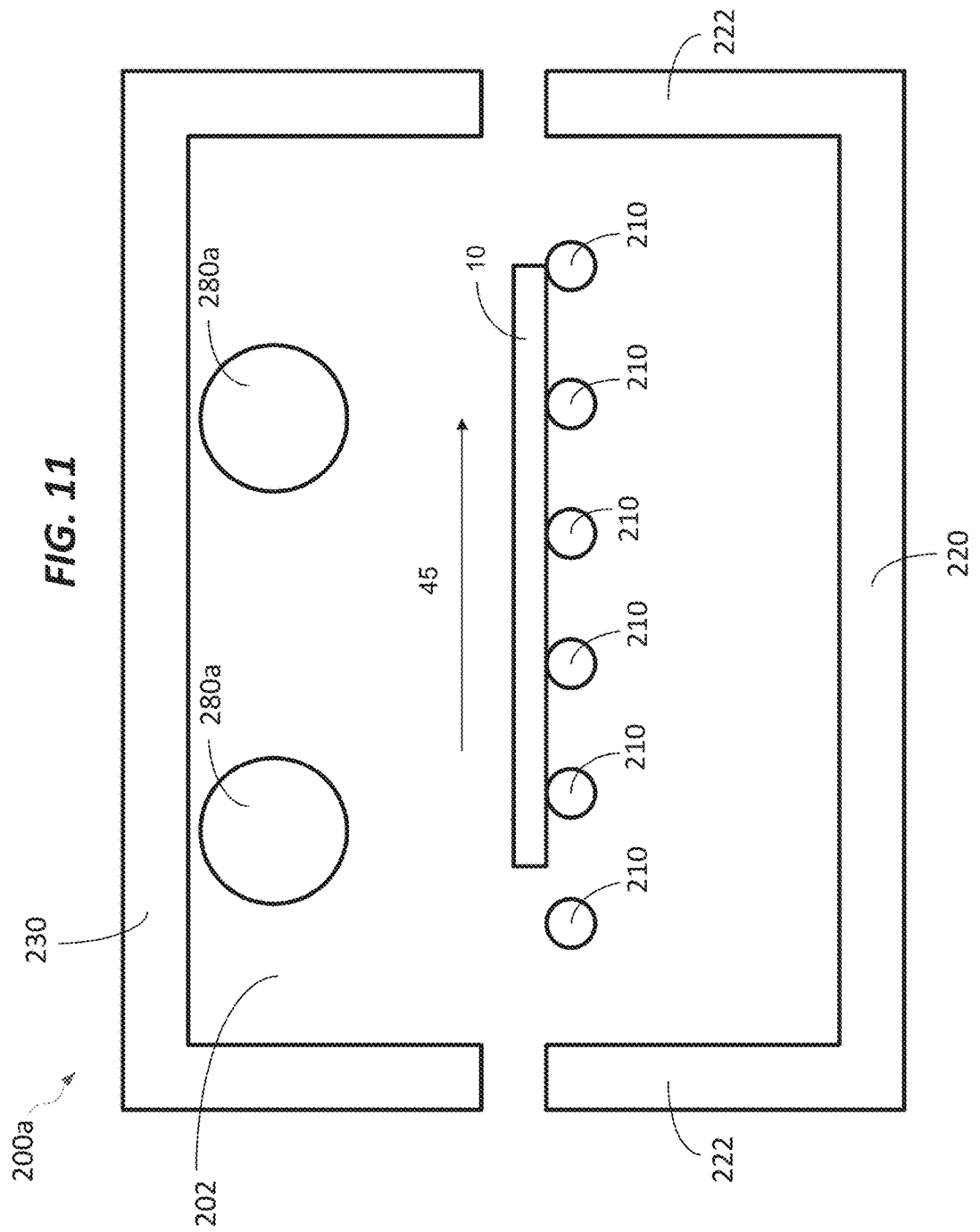
FIG. 11 is a schematic illustration of a sputtering chamber having one or more upper sputtering targets for use in accordance with certain embodiments.
Figure 12:
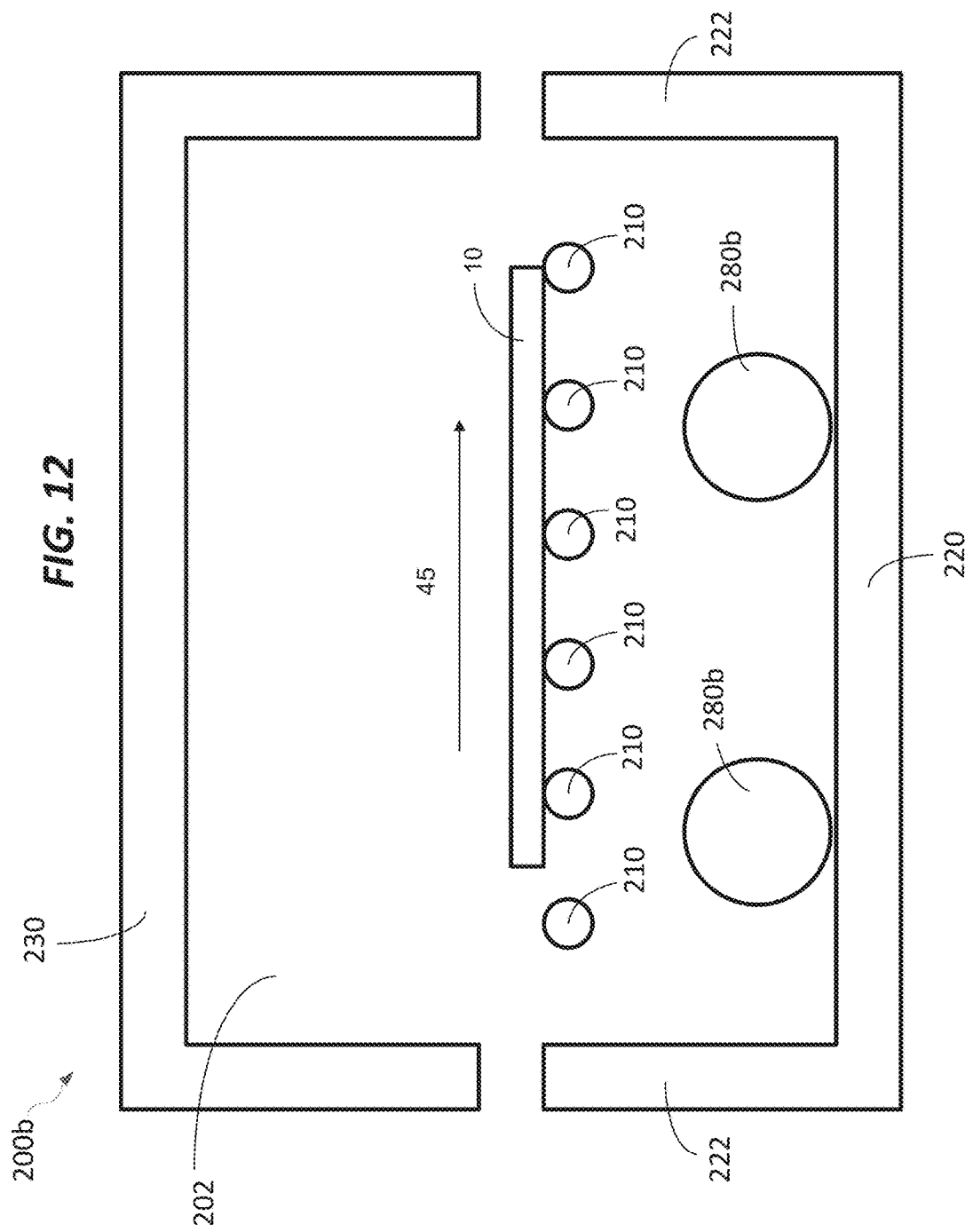
FIG. 12 is a schematic illustration of a sputtering chamber having one or more lower sputtering targets for use in accordance with certain embodiments.
Figure 13:
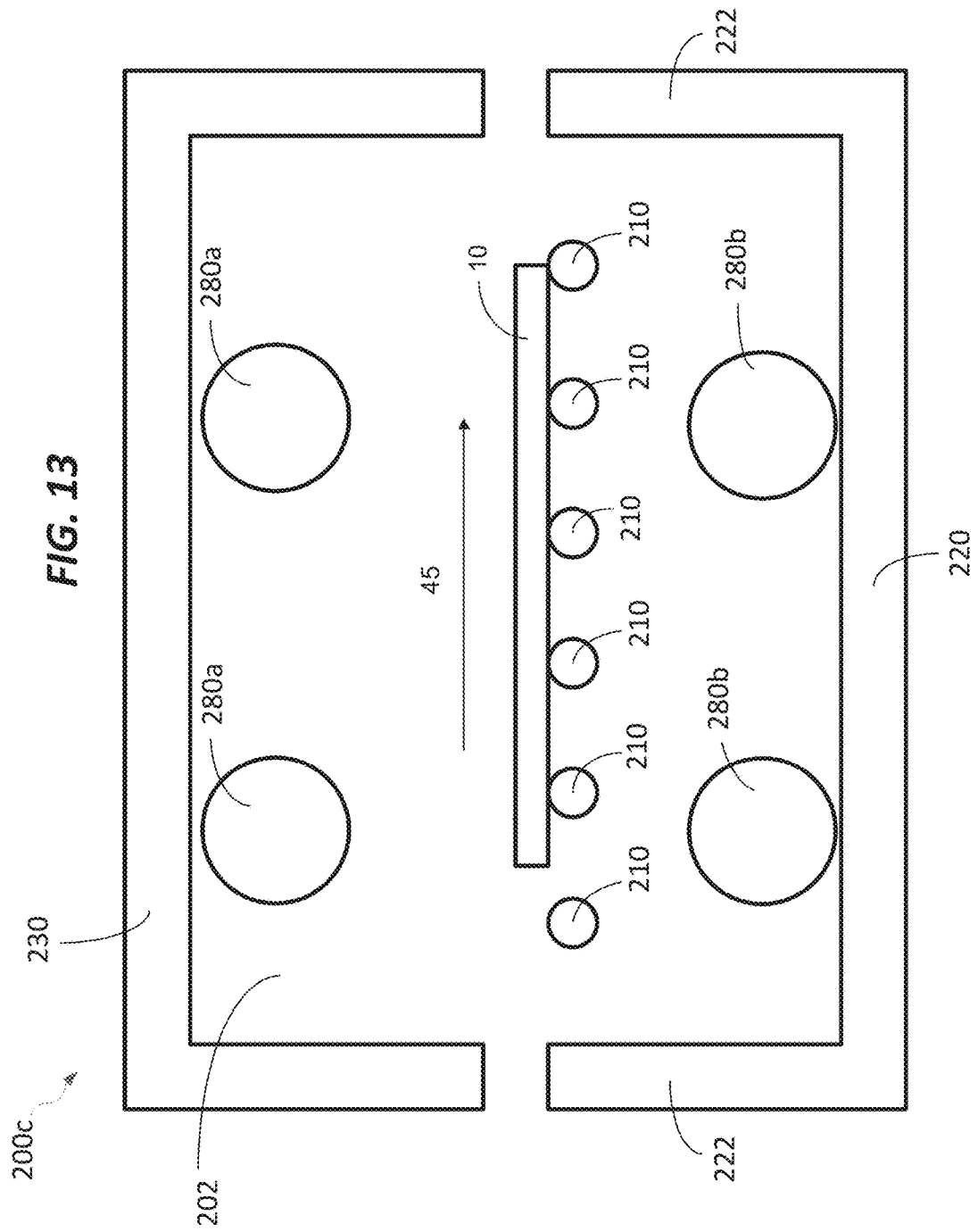
FIG. 13 is a schematic illustration of a sputtering chamber having one or more upper sputtering targets and one or more lower sputtering targets for use in accordance with certain embodiments.

In some cases, the sputter coater 105 includes at least one downward sputtering chamber (e.g., a sputtering chamber 200a as shown in FIG. 11) and at least one upward sputtering chamber (e.g., a sputtering chamber 200b as shown in FIG. 12). In other cases, the sputter coater 105 includes at least one dual direction sputtering chamber (e.g., a sputtering chamber 200c as shown in FIG. 13). The sputter coater 105 can include any combination of sputtering chambers 200a, 200b or 200c so long as the coater 105 includes one or more upper targets positioned above the plurality of transport rollers and one or more lower targets positioned beneath and/or between the plurality of transport rollers.

The sputter coater 120 is configured to deposit a second functional coating onto the second surface 14. The sputter coater 120 also includes one or more sputtering chambers. The one or more sputtering chambers of coater 120 include one or more upper targets positioned above the plurality of transport rollers. The one or more upper targets are configured to downwardly sputter a second functional coating onto the second surface 14.

In some cases, the sputter coater 120 includes at least one downward sputtering chamber (e.g., a sputtering chamber 200a as shown in FIG. 11). In other cases, the sputter coater 120 includes at least one dual direction sputtering chamber (e.g., a sputtering chamber 200c as shown in FIG. 13). The sputter coater 120 can include any combination of sputtering chambers 200a or 200c so long as the coater 120 includes one or more upper targets positioned above the plurality of transport rollers 210. The chambers can also be connected by a series of tunnels or inter-stage sections. The substrate 10 is conveyed along the path of substrate travel 45 over the plurality of transport rollers 210.

FIG. 11 illustrates one exemplary embodiment of a downward sputtering chamber 200a that can be provided as part of the sputter coater 105 or the sputter coater 120. The downward sputtering chamber 200a includes two spaced-apart upper sputtering targets 280a. FIG. 12 illustrates one exemplary embodiment of an upward sputtering chamber 200b that can be provided as part of sputter coater 105. The upward sputtering chamber 200b includes two spaced-apart lower sputtering targets 280b. FIG. 13 illustrate an exemplary embodiment of a dual direction sputtering chamber 200c that can be provided as part of the sputter coater 105 or the sputter coater 120. The dual direction sputtering chamber 200c includes two spaced-apart upper sputtering targets 280a and two spaced-apart lower sputtering targets 280b.

As shown in FIGS. 11-13, each sputtering chamber 200 includes a base (or "floor") 220, a plurality of side walls 222, and a ceiling (or "top lid" or "cover") 230, together bounding a sputtering cavity 202. While the FIGS. 11-13 show two spaced-apart upper and/or lower sputtering targets, this is by no means required. Rather, any suitable number of targets can be provided in any chamber. In some cases, a single sputtering target can be provided in any chamber.

Moreover, FIGS. 11-13 show cylindrical targets, but planar targets can also be used (in combination with, or in place of, cylindrical targets). In some embodiments, the lower sputtering targets are configured to sputter material upwardly between two transport rollers such that the material does not significantly deposit onto the transport rollers. In some cases, the transport roller directly before each lower sputter target and the transport roller directly after each sputter target are spaced apart a distance such that the sputtered material passes between each roller without significantly depositing onto either roller. In certain cases, the transport roller directly before each lower sputter target and the transport roller directly after each sputter target are spaced apart a distance that is larger than a distance other transport rollers are spaced apart. In other embodiments, the lower sputtering targets include magnets that provide for a racetrack that is narrow enough such that sputtered material moves narrowly between two transport rollers.

The positioning station 110 can include any substrate positioning mechanism or apparatus or equipment known in the art. In some cases, the positioning station is an apparatus that flips a substrate. For example, the apparatus can include equipment from Grenzeback Maschinebau GmbH or from Hegla GmbH & Co. In some cases, at the positioning station 110, the substrate 10 can be flipped and then immediately positioned back on the production line. For example, in the production line 100, the substrate 10 can exit a sputter coater 105, flip and then immediately enter a removing station 115. In the production line 150, the substrate 10 can exit the removing station 115, flip and then immediately enter a sputter coater 120.

In other cases, at the positioning station 110, the substrate 10 can be flipped and then stacked (or stacked and then flipped). The substrate 10 can remain in a stacked configuration for any length of time before being positioned back on the production line. The substrate 10 can also be stacked on a rack that can be moved between various regions of the production line. For example, in the production line 100, the substrate 10 can exit a sputter coater 105 and be stacked. The substrate 10 can later be flipped before being positioned to enter the removing station 115. In other cases, the substrate 10 can exit the sputter coater 105 and be flipped before being stacked. The substrate 10 can later simply be positioned to enter the removing station 115. In another example, in the production line 150, the substrate 10 can exit a removing station 115 and be stacked. The substrate 10 can later be flipped before being positioned to enter the sputter coater 120. In other cases, the substrate 10 can exit the removing station 115 and be flipped before being stacked. The substrate 10 can later simply be positioned to enter the sputter coater 120.

The removing station 115 can include any apparatus that removes the sacrificial coating 20 according to selected parameters. In some embodiments, the removing station 115 is configured to remove the sacrificial coating 20 using a wet removal process (e.g., a washing or wet etching process). Such a wet removal processes uses a removing solution to remove the sacrificial coating 20. In other embodiments, the removing station 115 is configured to remove the sacrificial coating 20 using a dry removal process (e.g., a dry etching process). Such a dry removal process uses removing particles to remove the sacrificial coating 20. In yet other embodiments, the removing station 115 is configured to remove the sacrificial coating 20 using both a wet and dry removal process.

In some cases, the removing station 115 is configured to remove the sacrificial coating 20 using a wet removal process (e.g., a washing or wet etching process). In certain cases, the removing station 115 includes or is configured as a washer. The washer can include a single washer or a plurality of washers that remove a sacrificial coating 20. In some cases, the washer includes a single washer that deposits a removal solution only. In other cases, the washer includes a single washer that deposits both a removal solution and water. In other cases, the washer includes a single washer that deposits a removal solution, a washing solution and water. In yet other cases, the washer includes a first washer that deposits a removal solution and a second washer that deposits washing solution and/or water. In some cases, the removal solution can be a solution having a pH of less than 5 or greater than 10. In other cases, the removal solution can be a wet etching solution. Also, the water can be deionized water or reverse osmosis treated water having a pH in the range of 5.4 to 9.4. Also, in some cases, the washer(s) can include a washing solution such as a detergent, which can also be deposited onto the substrate 10. Such a washing solution can include CRL Low-e Washing Machine Detergent obtained from C.R. Laurence Co., Inc. in some cases.

The washer(s) can be configured to remove a sacrificial coating 20 from a surface that is facing upward (by depositing removal solution) or from a surface that is facing downward (by depositing removal solution upward). For example, the washer of the removing station 115 in FIG. 3 would be configured to deposit removal solution downward. Also, the washer of the removing station 115 in FIG. 4 would be configured to deposit removal solution upward. The water and/or washing solution can also be deposited on either side of the substrate, to wash the first surface containing the functional coating 30 and/or to wash the second surface having a removed sacrificial coating 20. Also, the washer(s) can include additional optional washing or removing equipment, such as drum or cup brushes, to help remove the sacrificial coating 20. In some cases, the washer(s) can be obtained from Benteler International AG, such as a Benteler Washing Machine type 45.

In some cases, the removing station 115 is configured to remove the sacrificial coating 20 using a dry removal process. In some cases, the removing station 115 is provided as part of a vacuum and the dry removal process is performed under vacuum. For example, in some embodiments, the removing station 115 is provided as part of a vacuum that is separate from the vacuum that houses the sputter coater 120. In other cases, the removing station 115 is provided as part of the same vacuum that houses the sputter coater 120.

In some embodiments, the removing station 115 is configured as a plasma based dry etching system. Such a plasma based dry etching system includes a chamber containing an ion source and uses ions as removal particles to remove the sacrificial coating 20. In some cases, the ion source is a linear ion source. Suitable linear ion sources that can be used are Gencoa Ltd's im1500 or General Plasma Inc's PPALS. In other embodiments, the removing station 115 is configured to remove the sacrificial coating 20 using both a wet and dry removal process. In some cases, the removing station 115 can include a washer that removes the sacrificial coating 20 with a removal solution and a chamber that uses ions to remove any of the sacrificial coating 20 not removed by the removal solution.

Regardless of the removing technology used, the removing station 115 removes the sacrificial coating 20 while leaving intact the first functional coating 30. In some cases, the removing station 115 removes the sacrificial coating 20 while not functionally altering the first functional coating 30. As used herein, the phrase "not functionally altering" means that a functional coating 30 after removal of the sacrificial coating 20 has substantially the same functional properties as the same coating before removal.

Also, in some cases, the removing station 115 removes the sacrificial coating 20 while not removing more than 10% (or perhaps not more than 5%, 4%, 3%, 2% or 1%) of the first functional coating 30. In certain cases, the removing station 115 removes the sacrificial coating 20 while not removing any thickness of the first functional coating 30. In other cases, the first functional coating 30 comprises a transparent conductive oxide coating, wherein the transparent conductive oxide coating includes a transparent conductive oxide and an outer dielectric film (or overcoat), and wherein the removing station 115 removes the sacrificial coating 20 from the second surface while not removing any thickness of the transparent conductive oxide film.

Also, in other cases, the first functional 30 coating provides the substrate 10 with a surface roughness and the removing station 115 removes the sacrificial coating 20 without changing (e.g., without increasing) the surface roughness by more than 10% (e.g., by more than 5%, 4%, 3%, 2% or 1%). In yet other cases, the first functional coating 30 provides the substrate 10 with a sheet resistance and the removing station 115 removes the sacrificial coating 20 without changing (e.g., without increasing) the sheet resistance by more than 10% (e.g., by more than 5%, 4%, 3%, 2% or 1%). In still further cases, the first functional coating 30 provides the substrate 10 with a monolithic visible transmittance and the removing station 115 removes the sacrificial coating 20 without changing (e.g., without decreasing) the monolithic visible transmittance by more than 10% (e.g., by more than 5%, 4%, 3%, 2% or 1%). In even further cases, the first functional coating 30 provides the substrate 10 with a haze level and the removing station 115 removes the sacrificial coating 20 without changing (e.g., without increasing) the haze level by more than 10% (e.g., by more than 5%, 4%, 3%, 2% or 1%).

The heat treating station 125 is optional and can include any heat treating apparatus or equipment known in the art. In some cases, the heat treating station 125 is an annealing or tempering furnace. The present method is particularly advantageous in that a substrate bearing coating on both surfaces can be heat treated without exaggerating unwanted traces of contact from contact with transport rollers.

Figure 5:
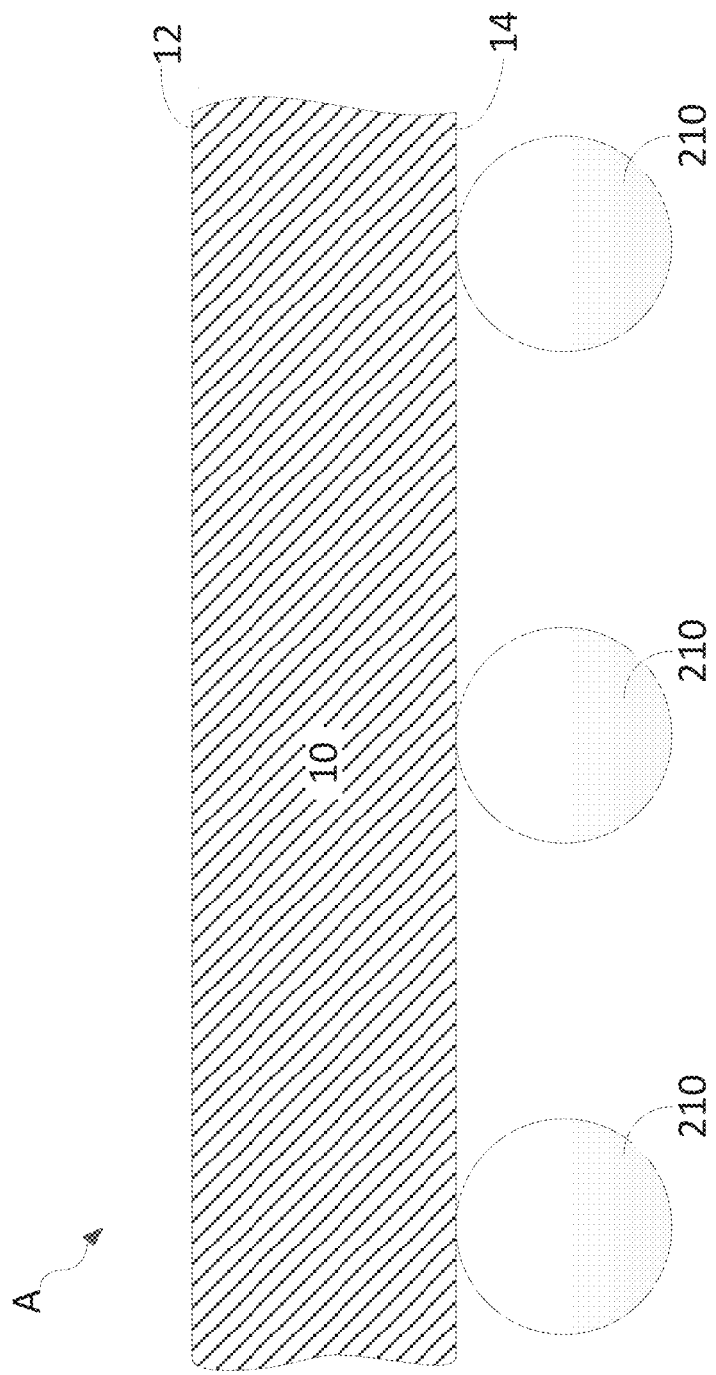
FIG. 5 is a schematic cross-sectional view of a substrate having a first surface and an opposed second surface, wherein the first surface and the second surface do not bear a coating in accordance with certain embodiments.
Figure 6:
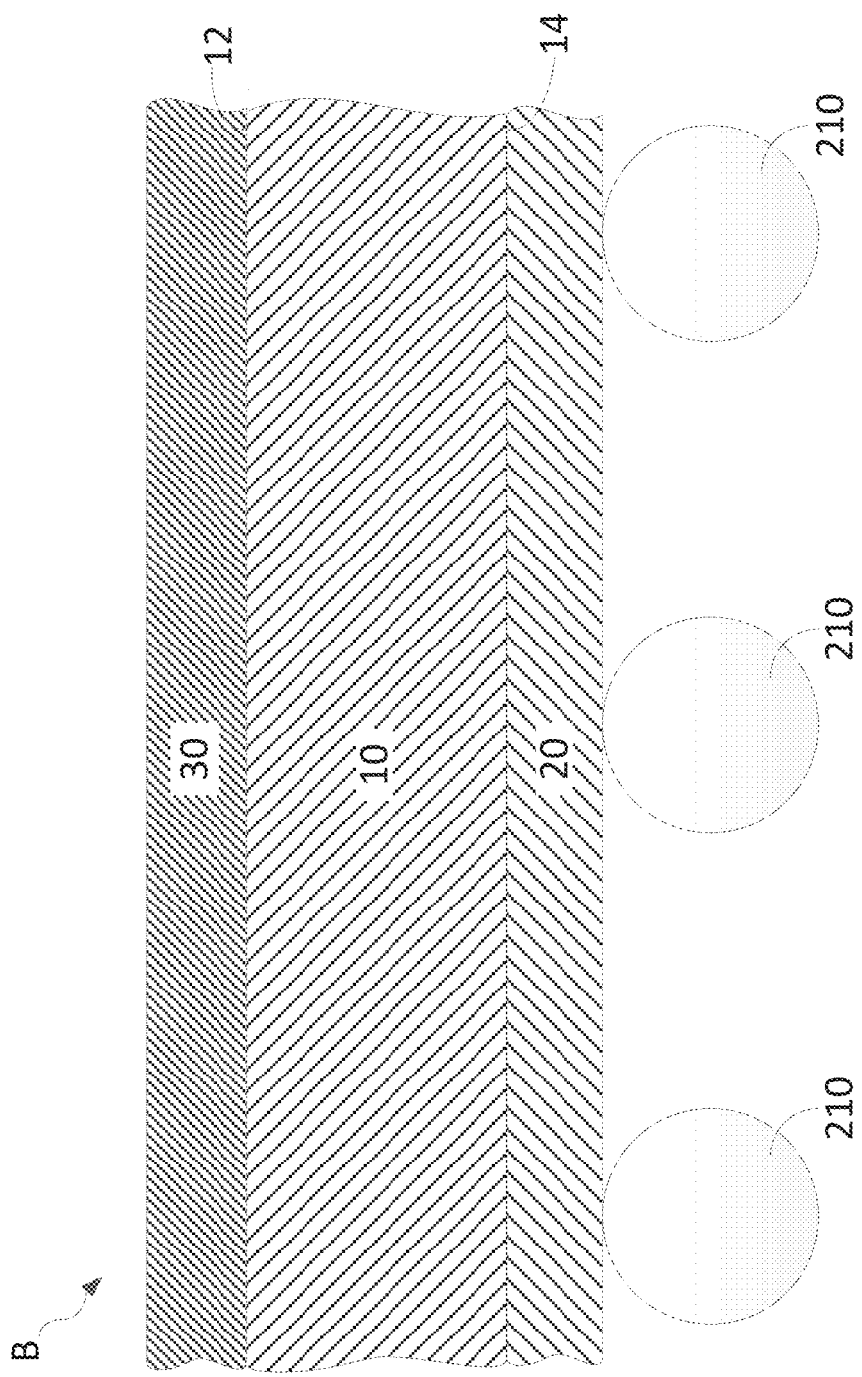
FIG. 6 is a schematic cross-sectional view of a substrate bearing a first functional coating on the first surface and a sacrificial functional coating on the second surface in accordance with certain embodiments.
Figure 7:
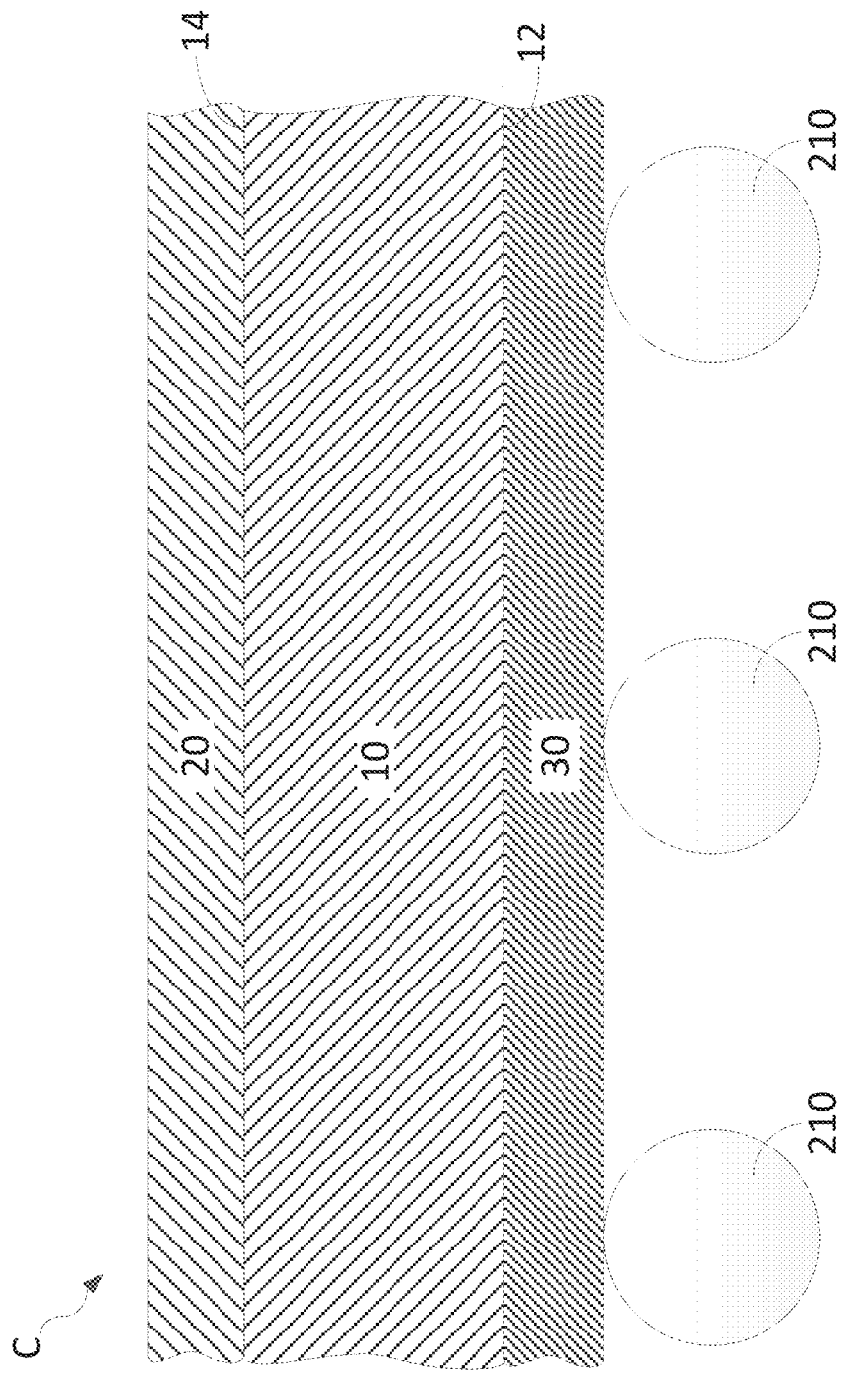
FIG. 7 is a schematic cross-sectional view of a substrate bearing a first functional coating on the first surface and a sacrificial functional coating on a second surface, wherein the substrate is positioned differently from the position shown in FIG. 6 in accordance with certain embodiments.
Figure 8:
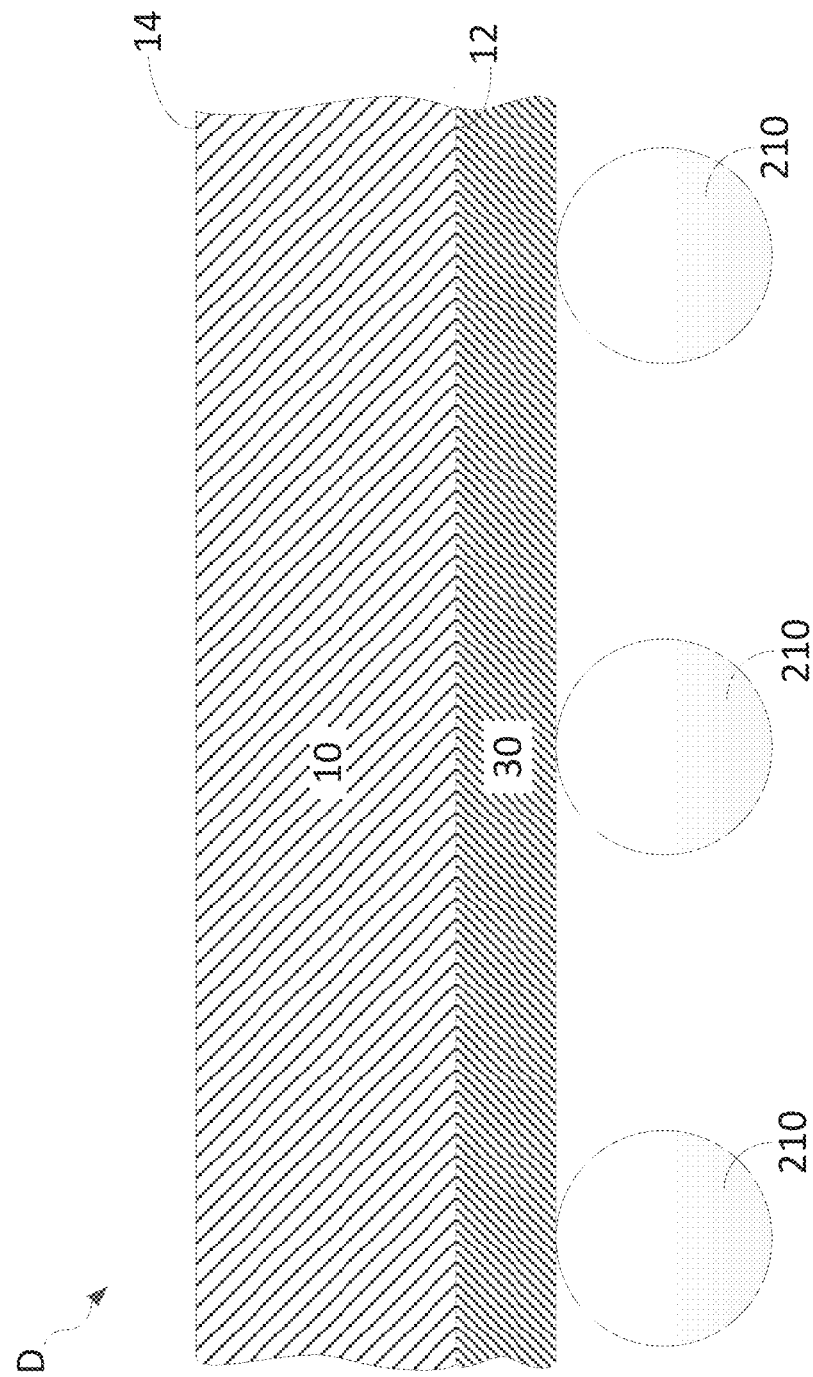
FIG. 8 is a schematic cross-sectional view of a substrate bearing a first functional coating on the first surface and wherein the second surface does not bear a coating in accordance with certain embodiments.
Figure 9:
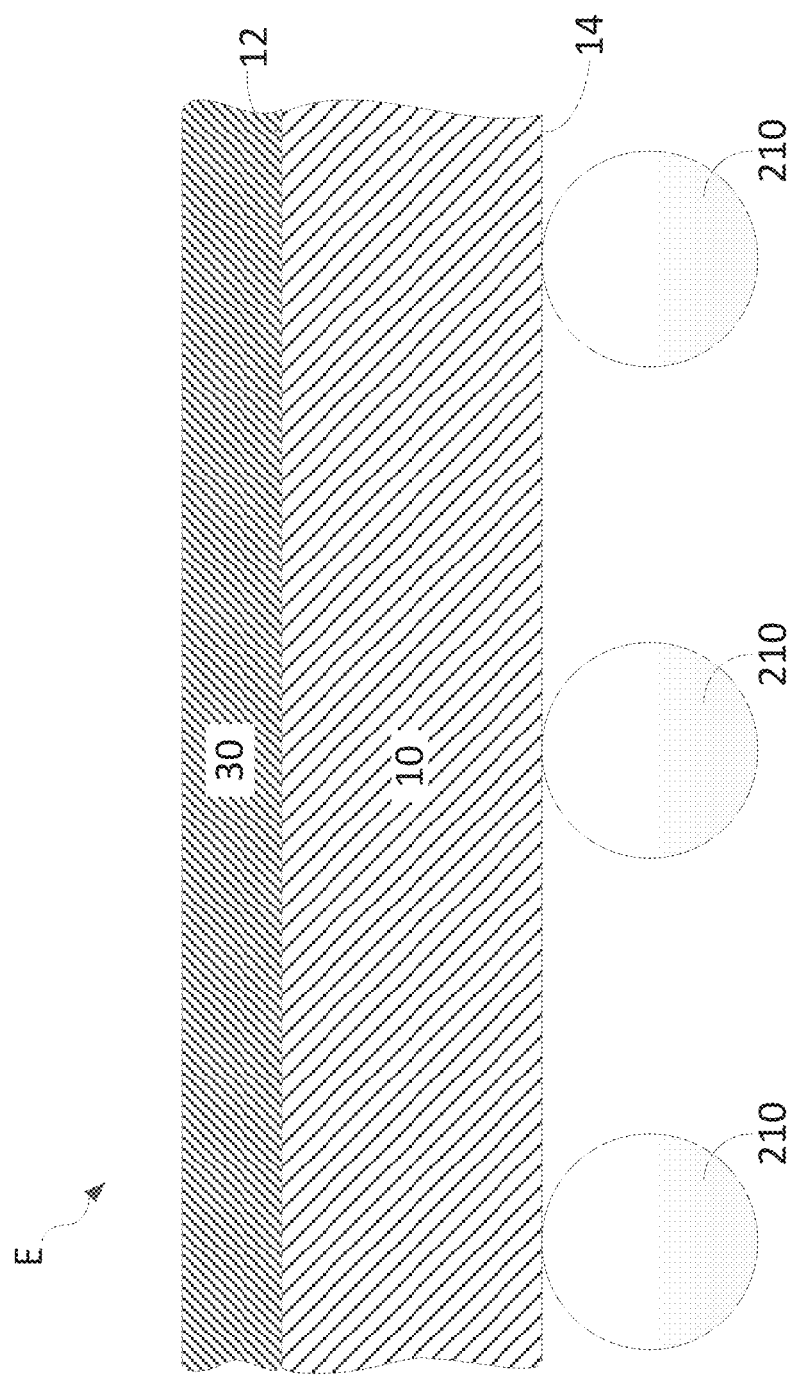
FIG. 9 is a schematic cross-sectional view of a substrate bearing a first functional coating on the first surface and wherein the second surface does not bear a coating and wherein the sheet of glass is positioned differently from the position shown in FIG. 8 in accordance with certain embodiments.

As shown in FIGS. 5-10, as the substrate 10 moves through the production lines 100, 150, it assumes different configurations. The movement of the substrate 10 through the production line 100 will now be described. As the substrate 10 moves through the production line 100, it assumes configurations A (as shown in FIG. 5), B (as shown in FIG. 6), C (as shown in FIG. 7), D (as shown in FIG. 8) and F (as shown in FIG. 9) at various stages. In some cases, the substrate 10 assumes configurations A, B, C, D and F in that order.

First, a substrate 10 having a first surface 12 and a second surface 14 is provided. The substrate 10 is positioned on the production line 100 such that it has a configuration A as shown in FIG. 5, wherein the first surface 12 is oriented upward (away from the plurality of transport rollers) and the second surface 14 contacts two or more of the plurality of transport rollers 210. The substrate 10 remains in this configuration A as it moves into the sputter coater 105.

The sputter coater 105 includes one or more upper targets positioned above the plurality of transport rollers and one or more lower targets positioned beneath the plurality of transport rollers. The one or more lower targets sputter up to deposit a sacrificial coating 20 onto the second surface 14 while the one or more upper targets sputter down to deposit a first functional coating 30 onto the first surface 12. In some cases, the one or more lower targets sputter up to deposit a sacrificial coating 20 onto the second surface 14 before the one or more upper targets sputter down to deposit a first functional coating 30 onto the first surface 12. In other cases, the one or more lower targets sputter up to deposit a sacrificial coating 20 onto the second surface 14 at the same time the one or more upper targets sputter down to deposit a first functional coating 30 onto the first surface 12. When the substrate 10 exits the sputter coater 105, it has a configuration B as shown in FIG. 6, wherein the first surface 12 bears a first functional coating 30 and the second surface 14 bears a sacrificial coating 20.

The substrate 10 remains in the configuration B as it moves through a positioning station 110. At the positioning station 110, the substrate 10 repositions from the configuration B to a configuration C as shown in FIG. 7. In the configuration C, the first surface 12 (bearing the first functional coating 30) contacts two or more of the plurality of transport rollers 210 and the second surface 14 (bearing the sacrificial coating 20) is oriented upward and faces away from the plurality of transport rollers 210. The substrate 10 can reposition using any mechanism known in the art.

The substrate having the configuration C then moves into a removing station 115. The removing station 115 removes the sacrificial coating 20 from the second surface 14. If the removing station 115 includes washer(s), the washer(s) deposit removal solution downward onto the second surface 14, which is facing upward, to remove the sacrificial coating 20. If the removing station 115 includes an ion source, the ions move downward onto the second surface 14, which is facing upward, to remove the sacrificial coating 20.

When the substrate exits the washer 115, it has a configuration D as shown in FIG. 8, wherein the first surface 12, which contacts two or more of the plurality of transport rollers 210, continues to bear the first functional coating 30 and the second surface 14 no longer bears the sacrificial coating 20. The second surface 14 is now free of sacrificial coating 20 and instead is an exposed substrate surface.

The substrate 10 remains in configuration D as it moves into the sputter coater 120. The sputter coater 120 includes one or more upper targets positioned above the plurality of transport rollers that sputter down to deposit a second functional coating 40 onto the exposed second surface 14. When the substrate exits the sputter coater 120, it has a configuration F, wherein the first surface 12 bears a first functional coating 30 and the second surface 14 bears a second functional coating 40.

Figure 10:
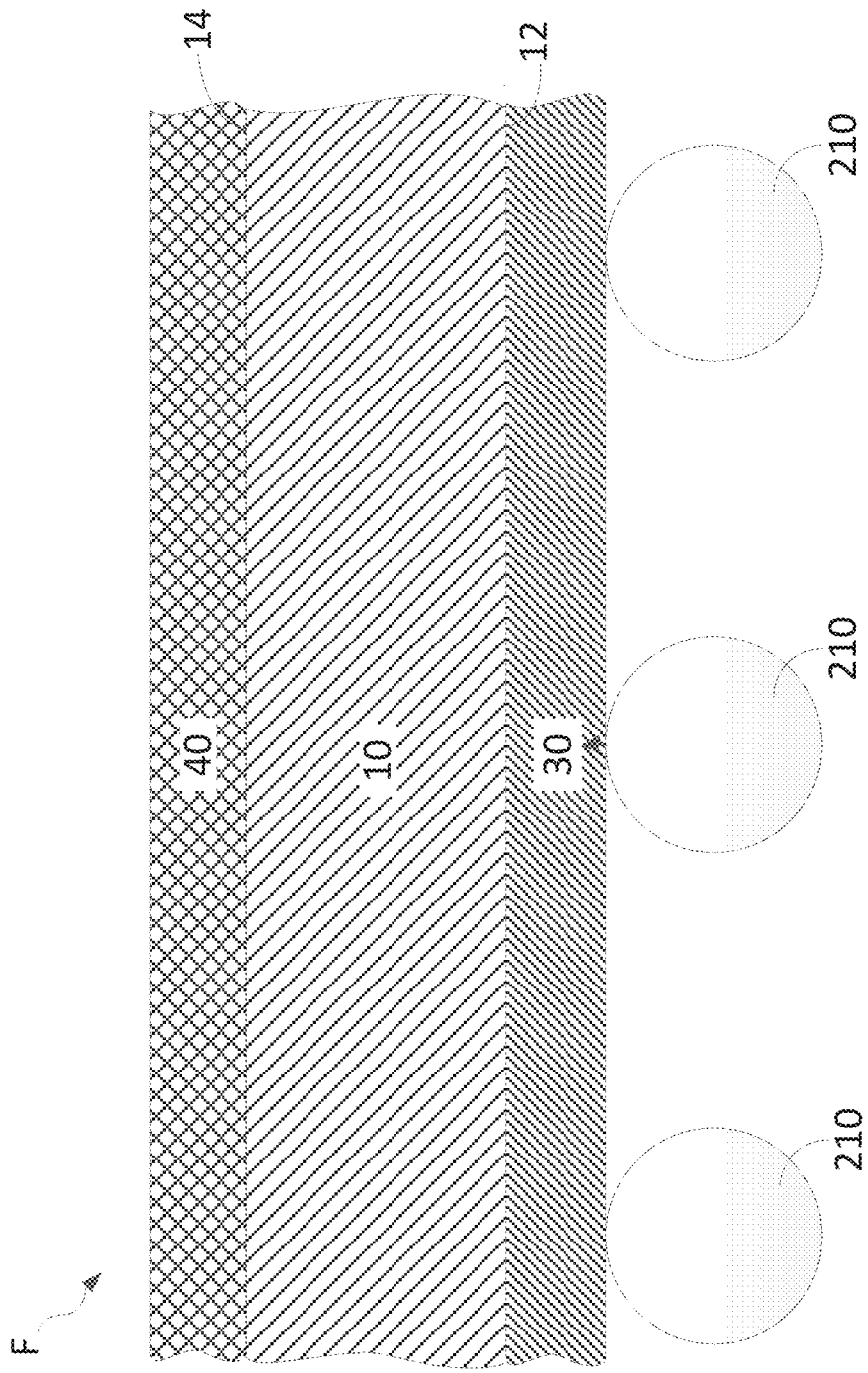
FIG. 10 is a schematic cross-sectional view of a substrate bearing a first functional coating on the first surface and a second functional coating on the second surface in accordance with certain embodiments.

The movement of the substrate 10 through the production line 150 will now be described. As the substrate 10 moves through the production line 150, it assumes configurations A (as shown in FIG. 5), B (as shown in FIG. 6), E (as shown in FIG. 9), D (as shown in FIG. 8) and F (as shown in FIG. 10) at various stages. In some cases, the substrate 10 assumes configurations A, B, E, D and F in that order.

First, a substrate 10 having a first surface 12 and a second surface 14 is provided. The substrate 10 is positioned on the production line 100 such that it has a configuration A as shown in FIG. 5, wherein the first surface 12 is oriented upward (away from the plurality of transport rollers) and the second surface 14 contacts two or more of the plurality of transport rollers 210. The substrate 10 remains in the configuration A as it moves into the sputter coater 105.

The sputter coater 105 includes one or more upper targets positioned above the plurality of transport rollers and one or more lower targets positioned beneath and/or between the plurality of transport rollers. The one or more upper targets sputter down to deposit a first functional coating 30 onto the first surface 12 while the one or more lower targets sputter up to deposit a sacrificial coating 20 onto the second surface 14. When the substrate 10 exits the sputter coater 105, it has a configuration B as shown in FIG. 6, wherein the first surface 12 bears a first functional coating 30 and the second surface 14 bears a sacrificial coating 20.

The substrate 10 remains in the configuration B as it moves into the removing station 115. The removing station 115 removes the sacrificial coating 20 from the second surface 14. If the removing station 115 includes washer(s), the washer(s) deposit removal solution upward onto the second surface 14, which is facing downward and contacting two or more of the plurality of transport rollers 210, to remove the sacrificial coating 20. If the removing station 115 includes an ion source, the ions move upward onto the second surface 14 to remove the sacrificial coating 20.

When the substrate exits the removing station 115, it has a configuration E as shown in FIG. 9, wherein the first surface 12 continues to bear the first functional coating 30 and faces away from the plurality of transport rollers 210 and the second surface 14, which contacts two or more of the plurality of transport rollers 210, no longer bears the sacrificial coating 20. The second surface 14 is now free of sacrificial coating 20 and instead is an exposed substrate surface.

The substrate remains in the configuration E as it moves into the positioning station 110. At the positioning station 110, the substrate 10 repositions so that it moves from configuration E to configuration D shown in FIG. 8. In the configuration D, the exterior surface 12 (bearing the first functional coating 30) contacts two or more of the plurality of transport rollers 210 and the exterior surface 14 (no longer bearing the sacrificial coating 20 and being an exposed glass surface) is oriented upward and faces away from the transport rollers 210.

The substrate 10 remains in configuration D as it moves into the sputter coater 120. The sputter coater 120 includes one or more upper targets positioned above the plurality of transport rollers that sputter down to deposit a second functional coating 40 onto the exposed second surface 14. When the substrate exits the sputter coater 120, it has a configuration F, wherein the first surface 12 bears a first functional coating 30 and the second surface 14 bears a second functional coating 40. The substrate can then enter an optional heat treating station 125.

Regardless of which production line 100 or 150 is used, a sacrificial coating 20 is used as part of the method. The sacrificial coating 20 is a removable, temporary protective coating. The sacrificial coating 20 is formed of a material that breaks down by a removal solution in a washer or by an etchant in the etcher of the removing station 115. By "broken down" or "breaks down" as used herein, we mean that the sacrificial coating 20 is actually removed by the removal solution or etchant. The sacrificial coating 20 is generally formed of material that breaks down in the presence of any desired removal solution or etchant.

In some cases, the sacrificial coating 20 has any of the embodiments described for a temporary protective cover 90 in U.S. Pat. No. 6,921,579, the contents concerning temporary protective covers 90 of which are incorporated herein by reference. In some cases, the sacrificial coating 20 is formed of a material that breaks down in the presence of an acidic removal solution or a basic removal solution. In certain cases, the sacrificial coating 20 is formed of material that breaks down in the presence of a moderate or highly acidic removal solution. In such cases, the removal solution can be a solution having a pH of less than 5. In other cases, the sacrificial coating 20 is formed of material that breaks down in the presence of a moderate or highly basic removal solution. In such cases, the removal solution can be a solution having a pH of greater than 9. In certain cases, the removal solution includes phosphoric acid and/or citric acid.

In other cases, the removal solution includes a material that removes the sacrificial coating 20 at a rate of at least 2,000 angstroms per minute, perhaps at least 5,000 angstroms per minute or even 10,000 angstroms per minute. In one example, the removal solution can include a solution containing 1 part phosphoric acid, 1 part citric acid and 30 parts water. Such as solution removes the sacrificial coating at a rate of up to 20,000 angstroms per minute.

As noted above, the sacrificial coating 20 is removable by a desired removal solution or etchant. Therefore, no particular minimum or maximum thickness is required. However, the sacrificial coating 20 should be thick enough to provide protection against contamination from residues on transport rollers 210 when moving through the production line. The sacrificial coating 20 should also be thin enough to allow complete, uniform removal of the sacrificial coating 30 upon contact with the removal solution or etchant.

In some cases, the sacrificial coating 20 has a total thickness of less than about 150 angstroms, perhaps of less than about 100 angstroms. In certain cases, the sacrificial coating 20 can have a thickness as small as about 5-10 angstroms. In other cases, the sacrificial coating 20 has a thickness in a range of between about 20 angstroms and about 60 angstroms, perhaps optimally between about 30 angstroms and about 50 angstroms.

In some embodiments, the sacrificial coating 20 includes an inorganic material. In some cases, the sacrificial coating 20 includes a metal. The term "metal" is used herein to refer to metals and metalloids or semi-metals. In some embodiments, the sacrificial coating 20 includes one or more metal layers. The metal layers include metals selected from the group consisting of aluminum, bismuth, cadmium, copper, iron, magnesium, nickel, tin, zinc or an alloy or mixture of any of these. In other embodiments, the sacrificial coating 20 includes one or more metal oxide layers. The metal oxide layers can include oxides of metals selected from the group consisting of aluminum, bismuth, cadmium, copper, iron, magnesium, nickel, tin, zinc or an alloy or mixture of any of these. The metals and oxides of this group are stable in water, but tend to break down in the presence of moderately to highly acidic removal solutions or moderately to highly basic removal solutions. Thus, they are readily removed when washed with highly acidic removal solutions or moderately to highly basic removal solutions. They are also believed to be adequately protective at the desired thickness ranges described herein.

In some cases, the sacrificial coating 20 includes zinc oxide. In certain cases, the sacrificial coating 20 is a single layer including zinc oxide, for example a single layer consisting essentially of pure zinc oxide. A sacrificial coating 20 formed of a single layer including zinc oxide can be effective in protecting the underlying surface against contamination by transport rollers at a thickness of less than about 150 angstroms. Further, zinc oxide is particularly easy to remove in a complete and uniform manner when washed with highly acidic removal solutions or moderately to highly basic removal solutions. Zinc oxide can also be sputtered at a very high rate and is consequently deposited at relatively low cost.

A metal oxide film in the sacrificial coating 20 can be deposited using a variety of sputter deposition processes in each sputtering chamber. One possibility for depositing a metal oxide film would be to sputter a target formed of the desired metal oxide itself in a non-reactive atmosphere, such as argon. However, targets formed of metal oxide tend not to sputter as reliably as pure metal targets, since metal oxides are less conductive than their respective metals. Thus, it can be difficult to reliably sputter a metal oxide target in a DC sputtering apparatus. As a consequence, metal oxide films are more commonly deposited by sputtering a metallic target in an oxidizing atmosphere. For example, a sacrificial coating 20 of zinc oxide can be deposited by sputtering a zinc target in an oxidizing atmosphere (i.e., at atmosphere that contains oxygen). Thus, in some embodiments, the sacrificial coating 20 is formed by sputtering a metallic target in an oxidizing atmosphere. As will be readily appreciated by skilled artisans, the sputtering atmosphere can be varied to achieve the desired sputtering rate. For example, while the sputtering atmosphere may consist of pure oxygen, this is certainly not a requirement. In fact, a mixture of oxygen and inert gas may enhance the sputtering rate. Thus, it is believed to be advantageous to employ a sputtering atmosphere comprising oxygen and up to about 60% argon (preferably between 0-40%). As will be readily appreciated by skilled artisans, the power applied to the sputtering target can be varied to control the sputtering rate and reduce arcing.

A metal film in the sacrificial coating 20 can also be deposited using a variety of sputter deposition processes in each sputtering chamber. One possibility for depositing a metal film would be to sputter a metallic target formed of the desired metal itself in a non-reactive atmosphere, such as argon. As will be readily appreciated by skilled artisans, the sputtering atmosphere can be varied to achieve the desired sputtering rate. Likewise, the power applied to the sputtering target can be varied to control the sputtering rate and reduce arcing.

The functional coating 30 can be a single layer or a stack of layers. Various functional coatings can be used. The functional coating 30 is preferably of a material that is durable to removal solution or etchant used to remove the sacrificial coating 20. In some cases, the functional coating 30 includes two or more layers each comprising oxide film, nitride film or oxynitride film, whereas the sacrificial coating 20 includes a single layer of an oxide or a metal film. In other cases, the functional coating 30 has a thickness of at least 500 angstroms wherein the sacrificial coating 20 has a thickness of less than 150 angstroms. When the functional coating 30 and the sacrificial coating 20 have these combination of features, the removal solution or etchant easily removes the sacrificial coating 20 while leaving intact the functional coating 30. For example, in some cases, the removal solution or etchant removes the sacrificial coating 20 while not functionally altering (or not optically altering) the functional coating 30. In other cases, the removal solution or etchant removes the sacrificial coating 20 while not removing more than 10% of thickness of the functional coating 30.

In some cases, the functional coating 30 comprises a transparent conductive oxide (or "TCO") coating. In certain cases, the functional coating 30 comprises a transparent conductive oxide coating, wherein the transparent conductive oxide coating includes a transparent conductive oxide film and an outer dielectric film (or overcoat). The outer dielectric film is a film that is further from the substrate than the transparent conductive oxide film. The transparent conductive oxide coating can also include an optional base coat in between the transparent conductive oxide film and the substrate.

The transparent conducting oxide coating can also have a thickness of greater than 500 angstroms. In some cases, the transparent conducting oxide film can also have a thickness in the range of 150 angstroms to 1,500 angstroms and the outer dielectric film can have a thickness in the range of 400 angstroms to 1,200 angstroms.

In some cases, the transparent conducting oxide coating includes a transparent conductive oxide film comprising indium tin oxide. Thus, the transparent conducting oxide film may comprise indium tin oxide. In such cases, the indium tin oxide film comprises indium tin oxide, optionally together with one or more other materials. If desired, zinc, aluminum, antimony, fluorine, carbon nanotubes, or other components can be included in the film. When provided, the indium tin oxide film preferably consists essentially of (e.g., contains more than 95% by weight), or consists of, indium tin oxide. A suitable indium tin oxide film can contain various relative percentages of indium and tin. On a metal-only basis, indium preferably is the major constituent. That is, indium preferably accounts for more than 50% of the film's total metal weight. The composition of such a film, on a metal-only weight basis, can optionally range from about 75% indium/25% tin to about 95% indium/5% tin, such as about 90% indium/10% tin.

The transparent conducting oxide coating can alternatively include a transparent conductive oxide film comprising fluorinated tin oxide ("FTO"), doped zinc oxide, such as aluminum-doped zinc oxide ("AZO"), doped titanium dioxide, such as niobium-doped $TiO_2$ ("NTO"), or any other transparent conductive oxide material.

The outer dielectric film or overcoat can be formed of various materials. For example, it can be formed of silicon nitride, silicon dioxide, silicon oxynitride, aluminum oxide, aluminum nitride, aluminum oxynitride, tin oxide, titanium oxide, titanium oxynitride or a combination of any of these. In some cases, the outer dielectric film comprises silicon nitride. Alternatively, in other cases, the outer dielectric film comprises titanium oxide. In some cases, the outer dielectric film comprises a plurality of films. The optional base coat can also be formed of various materials. In some cases, the base coat comprises silicon oxide.

When the first functional coating 30 is a transparent conductive oxide coating, the removal solution or etchant removes the sacrificial coating 20 while not functionally altering the transparent conductive oxide coating. As used herein, the phrase "not functionally altering" means that a transparent conductive oxide coating after removal of the sacrificial coating 20 has substantially the same functional properties as the same coating before removal. In other cases, the removal solution or etchant removes the sacrificial coating 20 while not optically altering the transparent conductive oxide coating.

Also, in some cases, the removal solution or etchant removes the sacrificial coating 20 while not removing more than 10% of the thickness of the transparent conductive oxide coating. As an example, if the transparent conductive oxide coating as a thickness of about 1,300 angstroms, after removing the sacrificial coating 20, the transparent conductive oxide coating still has a thickness of at least about 1,170 angstroms. In other cases, the removal solution or etchant removes the sacrificial coating 20 while not removing more than 5%, 4%, 3%, 2% or 1% of the thickness of the transparent conductive oxide coating. In certain cases, the removal solution or etchant removes the sacrificial coating 20 while not removing any substantial thickness of the transparent conductive oxide coating. In other cases, the transparent conductive oxide coating includes a transparent conductive oxide film and an outer dielectric film and the removal solution or etchant removes the sacrificial coating 20 while not removing any thickness of the transparent conductive oxide film.

In other cases, the transparent conductive oxide coating provides the substrate 10 with a specific surface roughness $R_a$ and the removal solution or etchant removes the sacrificial coating 20 without changing the surface roughness $R_a$ by more than 10%. In certain cases, the removal solution or etchant removes the sacrificial coating 20 without increasing the surface roughness $R_a$ by more than 10%. Surface roughness is defined in terms of deviations from the mean surface level. The surface roughness $R_a$ is the arithmetical mean surface roughness. This is the arithmetic average of the absolute deviations from the mean surface level. The arithmetical mean surface roughness of a coating is commonly represented by the equation: $R_a = 1/L \int_0^L |f(x)| dx$. The surface roughness $R_a$ can be measured in conventional fashion, e.g., using an Atomic Force Microscope (AFM) equipped with conventional software that gives $R_a$. In other embodiments, the removal solution or etchant removes the sacrificial coating 20 without increasing the surface roughness $R_a$ by more than 5%, 4%, 3%, 2% or 1%. In some embodiments, the removal solution or etchant removes the sacrificial coating 20 without substantially increasing the surface roughness $R_a$.

In other cases, the transparent conductive oxide coating provides the substrate 10 with a specific sheet resistance and the removal solution or etchant removes the sacrificial coating 20 without changing the sheet resistance by more than 10%. In certain cases, the removal solution or etchant removes the sacrificial coating 20 without increasing the sheet resistance by more than 5%. Sheet resistance can be measured in standard fashion using a non-contact sheet resistance meter. In other embodiments, the removal solution or etchant removes the sacrificial coating 20 without increasing the sheet resistance by more than 4%, 3%, 2% or 1%. In some embodiments, the removal solution or etchant removes the sacrificial coating 20 without substantially increasing the sheet resistance.

In yet other cases, the transparent conductive oxide coating provides the substrate 10 with a specific monolithic visible transmittance $T_v$ and the removal solution or etchant removes the sacrificial coating 20 without changing the monolithic visible transmittance $T_v$ by more than 10%. In certain cases, the removal solution or etchant removes the sacrificial coating 20 without decreasing the monolithic visible transmittance $T_v$ by more than 10%. The term "visible transmission" is well known in the art and is used herein in accordance with its well-known meaning to refer to the percentage of all incident visible radiation that is transmitted through the substrate 10. Visible radiation constitutes the wavelength range of between about 380 nm and about 780 nm. Visible transmittance, as well as visible reflectance, can be determined in accordance with NFRC 300-2014, Standard Test Method for Determining the Solar and Infrared Optical Properties of Glazing Materials and Fading Resistance of Systems. The well-known WINDOW 7.1 computer program can be used in calculating these and other reported optical properties. In other embodiments, the removal solution or etchant removes the sacrificial coating 20 without decreasing the visible transmittance $T_v$ by more than 5%, 4%, 3%, 2% or 1%. In some embodiments, the removal solution or etchant removes the sacrificial coating 20 without substantially decreasing the visible transmittance $T_v$.

In even further cases, the transparent conductive oxide coating provides the substrate 10 with a specific haze level and the removal solution or etchant removes the sacrificial coating 20 without changing the haze level by more than 10%. In certain cases, the removal solution or etchant removes the sacrificial coating 20 without increasing the haze level by more than 10%. Haze can be measured in well-known fashion, e.g., using a BYK Haze-Gard plus instrument. Reference is made to ASTM D 1003-00: Standard Test method for Haze and Luminous Transmittance of Transparent Plastics, the contents of which are incorporated herein by reference. In other embodiments, the removal solution or etchant removes the sacrificial coating 20 without increasing the haze level by more than 5%, 4%, 3%, 2% or 1%. In some embodiments, the removal solution or etchant removes the sacrificial coating 20 without substantially increasing the haze level.

Figure 14:
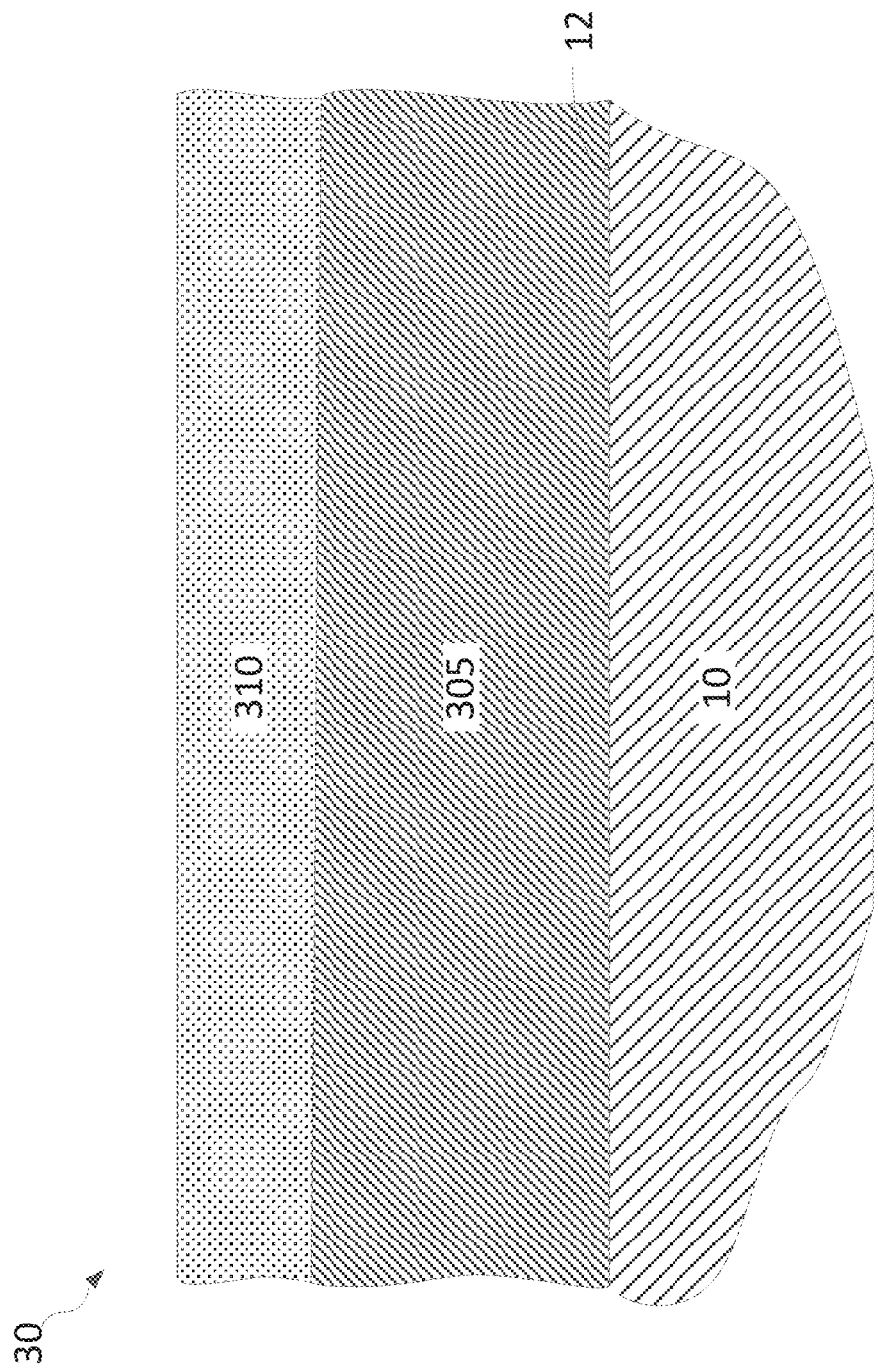
FIG. 14 is a schematic cross-sectional view of a substrate having the first surface carrying a transparent conducting oxide coating in accordance with certain embodiments.

FIGS. 14-18 exemplifies certain embodiments that provide a coated substrate 10 having an exterior surface 12 bearing a transparent conducting oxide coating 30. FIG. 14 illustrates one embodiment of a functional coating 30 that is a transparent conducting oxide coating. Generally, the coating 30 includes, in sequence from the exterior surface 12 outward, a transparent conducting oxide film 305 and a dielectric film 310. In some cases, the transparent conducting oxide film 305 comprises indium tin oxide. Such a transparent conducting oxide film can have a thickness in the range of 150 angstroms to 1,500 angstroms, for example a thickness of about 1,325 angstroms. Also, in some cases, the dielectric film 310 comprises silicon nitride. The dielectric film 310 can have a thickness in the range of 400 angstroms to 1,200 angstroms, for example a thickness of about 440 angstroms.

Figure 15:
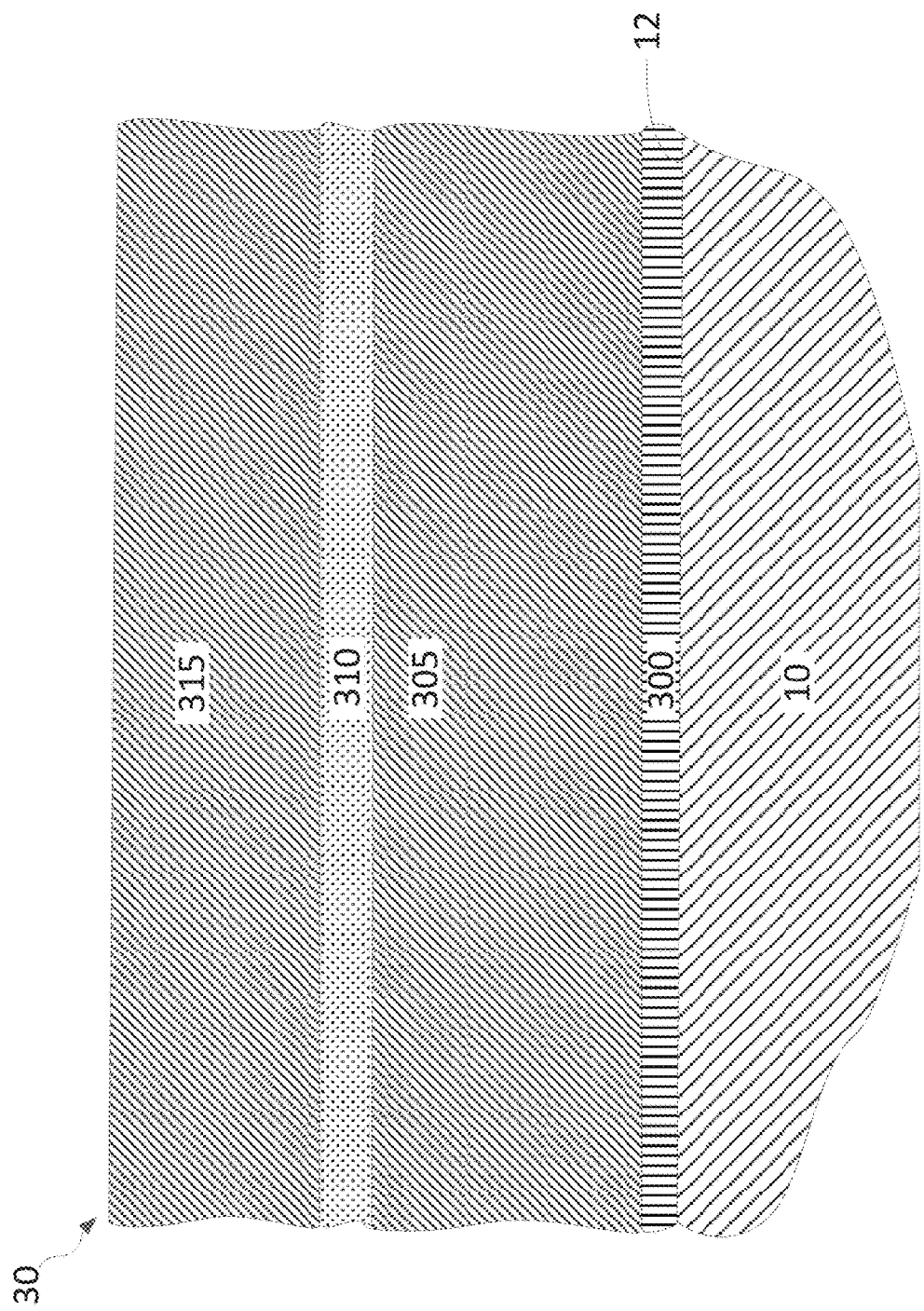
FIG. 15 is a schematic cross-sectional view of a substrate having the first surface carrying another transparent conducting oxide coating in accordance with certain embodiments.

FIG. 15 illustrates another embodiment of a functional coating 30 that is a transparent conducting oxide coating. Here, the coating 30 includes, in sequence from the exterior surface 12 outward, a transparent conducting oxide film 305, a first dielectric film 310 and a second dielectric film 315. In some cases, the coating includes an optional base film 300 in between the substrate 10 and the transparent conducting oxide film 305. The optional base film 300 can comprise silicon oxide in some cases. Also, the optional base film 300 can have a thickness in the range of 50 angstroms to 250 angstroms, for example a thickness of about 100 angstroms. In certain cases, the transparent conducting oxide film 305 comprises indium tin oxide. Such a transparent conducting oxide film can have a thickness in the range of 150 angstroms to 1,500 angstroms, for example a thickness of about 1,400 angstroms. Also, in some cases, the first dielectric film 310 comprises silicon nitride. In other cases, the first dielectric film 310 comprises tin oxide. The first dielectric film 310 can have a thickness in the range of 100 angstroms to 300 angstroms, for example a thickness of about 150 angstroms. Further, in some cases, the second dielectric film 315 comprises silicon oxynitride. The second dielectric film 315 can have a thickness in the range of 400 angstroms to 1,200 angstroms, for example a thickness of about 900 angstroms.

Figure 16:
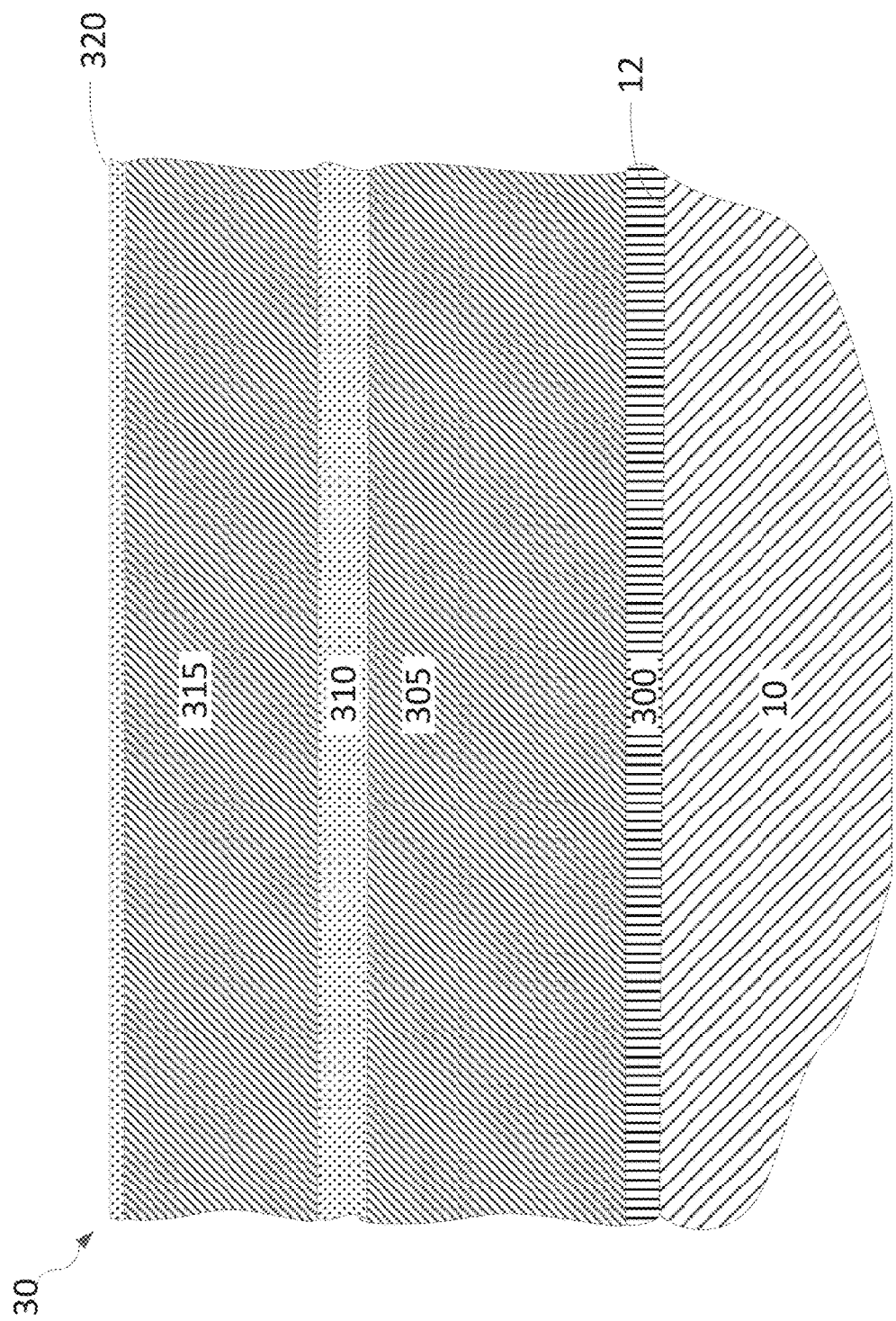
FIG. 16 is a schematic cross-sectional view of a substrate having the first surface carrying another transparent conducting oxide coating in accordance with certain embodiments.

FIG. 16 illustrates another embodiment of a functional coating 30 that is a transparent conducting oxide coating. The coating 30 includes, in sequence from the exterior surface 12 outward, a transparent conducting oxide film 305, a first dielectric film 310, a second dielectric film 315 and a third dielectric film 320. In some cases, the coating includes an optional base film 300 in between the substrate 10 and the transparent conducting oxide film 305. The optional base film 30 can comprise silicon oxide in some cases. Also, the optional base film 300 can have a thickness in the range of 50 angstroms to 250 angstroms, for example a thickness of about 100 angstroms. In certain cases, the transparent conducting oxide film 305 comprises indium tin oxide. Such a transparent conducting oxide film can have a thickness in the range of 150 angstroms to 1,500 angstroms. Also, in some cases, the first dielectric film 310 comprises silicon nitride. The first dielectric film 310 can have a thickness in the range of 100 angstroms to 300 angstroms, for example a thickness of about 150 angstroms. Further, in some cases, the second dielectric film 315 comprises silicon oxynitride. The second dielectric film 315 can have a thickness in the range of 400 angstroms to 1,200 angstroms, for example a thickness of about 900 angstroms. Finally, in some cases, the third dielectric film 320 comprises titanium oxide. The third dielectric film 320 can have a thickness in the range of 20 angstroms to 120 angstroms, for example a thickness of about 50 angstroms.

Figure 17:
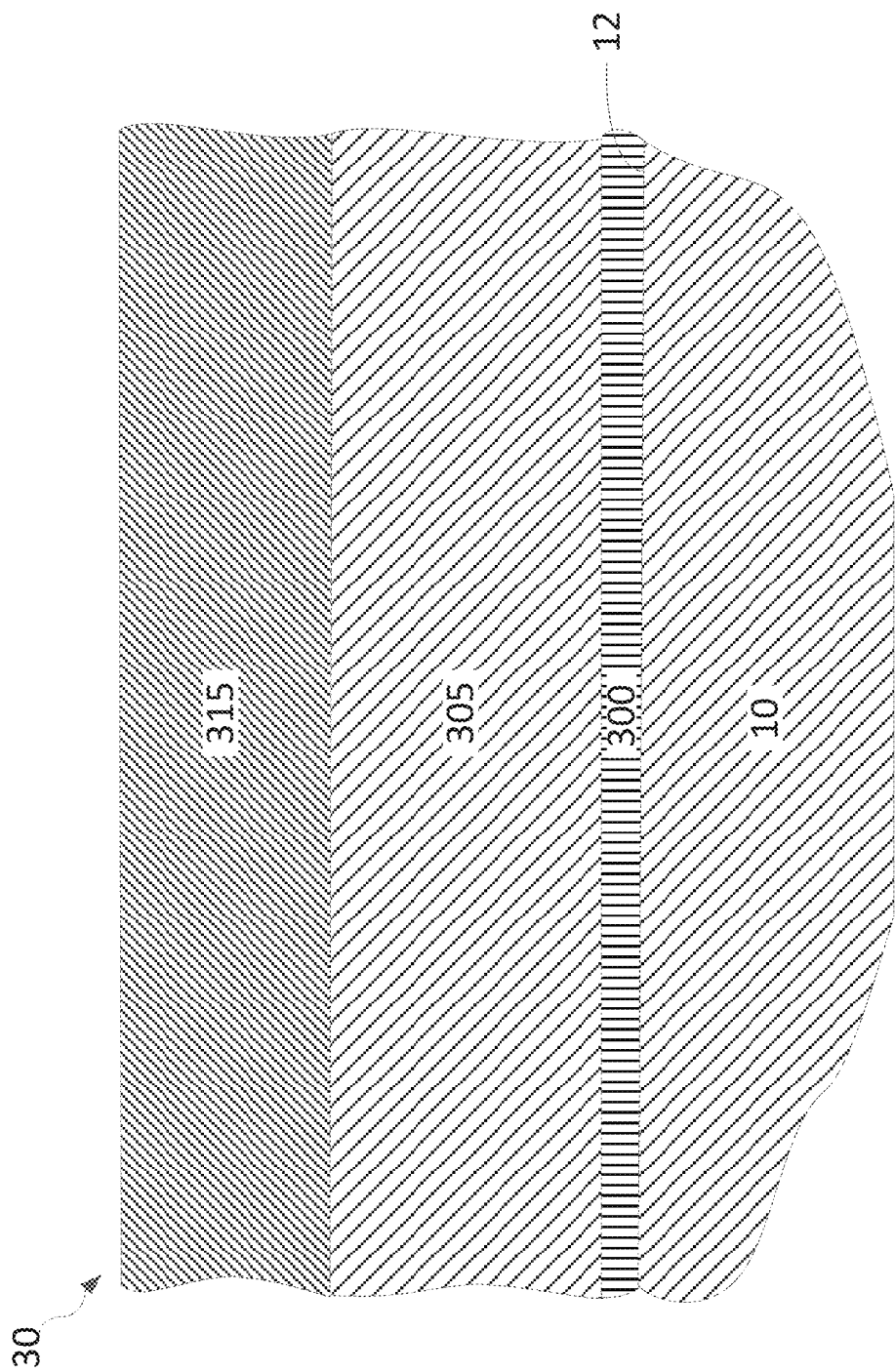
FIG. 17 is a schematic cross-sectional view of a substrate having the first surface carrying another transparent conducting oxide coating in accordance with certain embodiments.

FIG. 17 illustrates even another embodiment of a functional coating 30 that is a transparent conducting oxide coating. The coating 30 includes, in sequence from the exterior surface 12 outward, a transparent conducting oxide film 305 and a dielectric film 315. In some cases, the coating includes an optional base film 300 in between the substrate 10 and the transparent conducting oxide film 305. The optional base film 30 can comprise silicon oxide in some cases. Also, the optional base film 300 can have a thickness in the range of 50 angstroms to 250 angstroms, for example a thickness of about 100 angstroms. In certain cases, the transparent conducting oxide film 305 comprises indium tin oxide. Such a transparent conducting oxide film can have a thickness in the range of 150 angstroms to 1,500 angstroms, for example a thickness of about 1350 angstroms. Also, in some cases, the dielectric film 315 comprises silicon oxynitride. The dielectric film 315 can have a thickness in the range of 400 angstroms to 1,200 angstroms, for example a thickness of about 940 angstroms.

Figure 18:
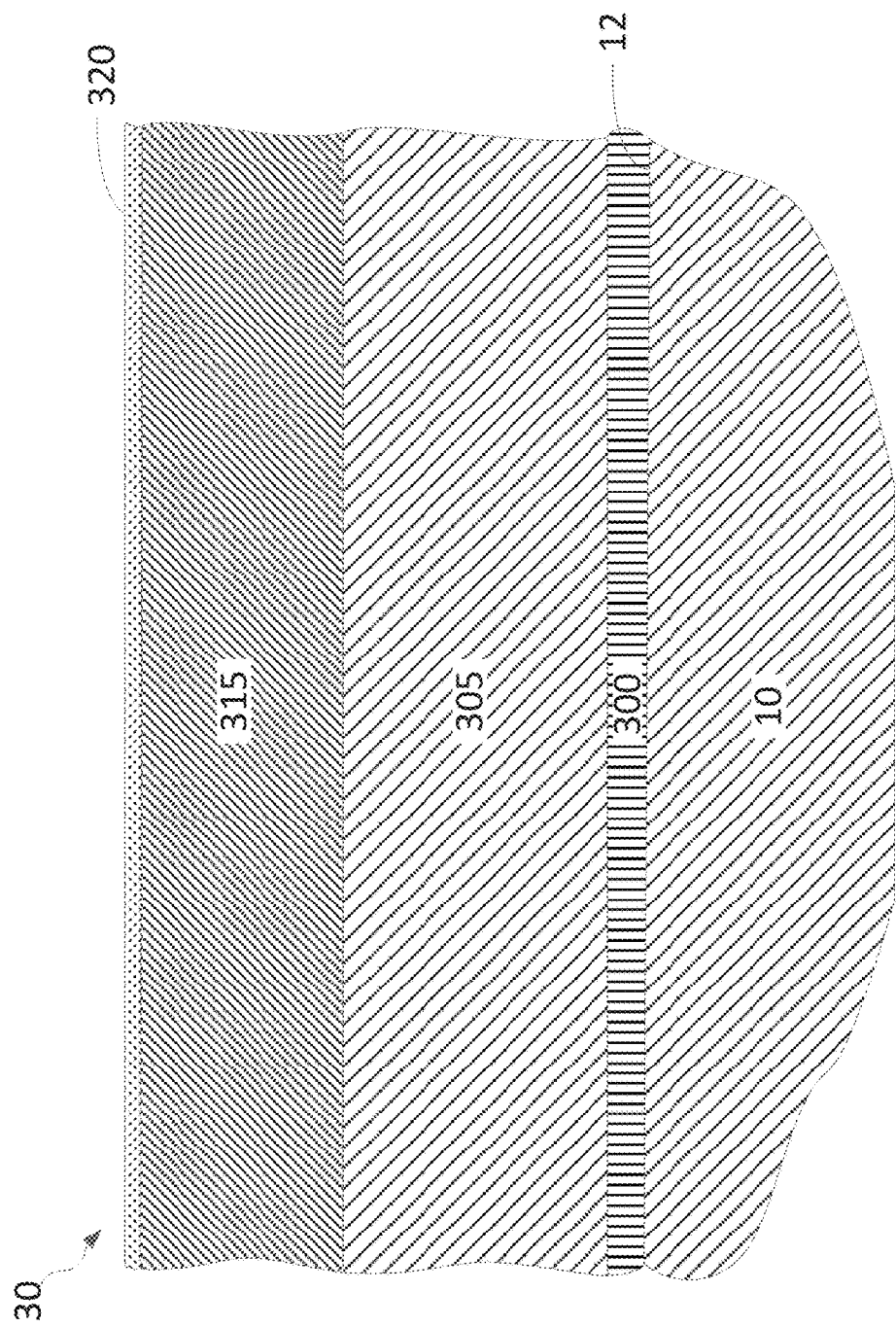
FIG. 18 is a schematic cross-sectional view of a substrate having the first surface carrying another transparent conducting oxide coating in accordance with certain embodiments.

FIG. 18 illustrates yet another embodiment of a functional coating 30 that is a transparent conducting oxide coating. The coating 30 includes, in sequence from the exterior surface 12 outward, a transparent conducting oxide film 305, a dielectric film 315 and a dielectric film 320. In some cases, the coating includes an optional base film 300 in between the substrate 10 and the transparent conducting oxide film 305. The optional base film 30 can comprise silicon oxide in some cases. Also, the optional base film 300 can have a thickness in the range of 50 angstroms to 250 angstroms, for example a thickness of about 100 angstroms. In certain cases, the transparent conducting oxide film 305 comprises indium tin oxide. Such a transparent conducting oxide film can have a thickness in the range of 150 angstroms to 1,500 angstroms, for example a thickness of about 1350 angstroms. Also, in some cases, the dielectric film 315 comprises silicon oxynitride. The dielectric film 315 can have a thickness in the range of 400 angstroms to 1,200 angstroms, for example a thickness of about 940 angstroms. The dielectric film 320 can comprise titanium oxide. The third dielectric film 320 can also have a thickness in the range of 20 angstroms to 120 angstroms, for example a thickness of about 50 angstroms.

Figure 19:
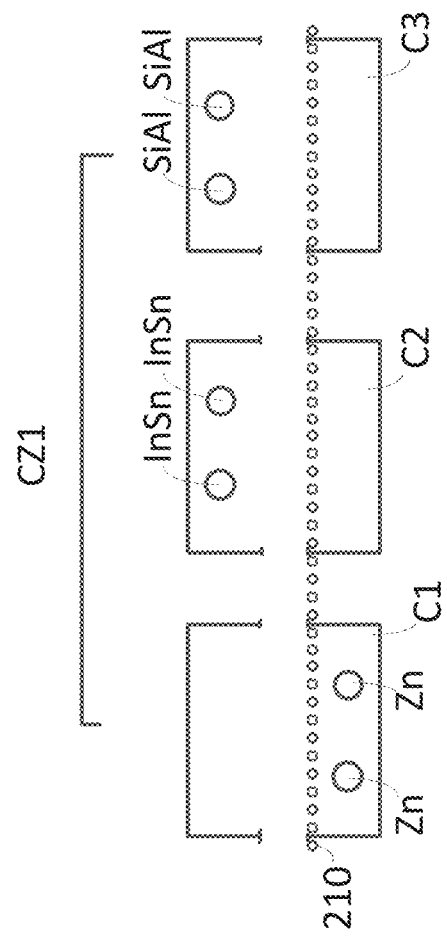
FIG. 19 is a schematic cross-sectional view of a coater for depositing both a sacrificial coating and a transparent conducting oxide coating in accordance with certain embodiments.

Turning now to FIG. 19, there is depicted an exemplary coater for depositing a zinc oxide sacrificial coating 20 and a transparent conducting oxide coating 30 as shown in FIG. 14 in accordance with certain embodiments of the invention. The coater includes a first coat zone CZ1, which in turn includes a first sputtering chamber C1, a second sputtering chamber C2 and a third sputtering chamber C3. In some cases, the coater 105 of FIG. 3 or 4 can include a coater as depicted in FIG. 19.

The first sputtering chamber C1 includes lower targets that sputter up a zinc oxide sacrificial coating 20 onto a second surface 14 of a substrate. The first sputtering chamber C1 includes two lower targets formed of metallic zinc. The metallic zinc targets are sputtered at a power level of about 12 kW in a sputtering atmosphere comprising 100% oxygen to sputter up a zinc oxide sacrificial coating 20. The substrate is moved past the zinc targets at a rate of about 300 inches per minute.

The second sputtering chamber C2 and third sputtering chamber C3 include upper targets that sputter down a transparent conducting oxide coating 30 onto a first surface of the substrate. The second sputtering chamber C2 includes two rotatable metallic indium tin targets (90% indium, 10% tin, by weight). The indium tin targets are sputtered at a power level of about 16 kW in a sputtering atmosphere of 5 mTorr with a gas flow of 601 sccm/min argon and 100 sccm/min oxygen. The substrate is moved past the indium tin oxide targets at a rate of about 60 inches per minute.

The third sputtering chamber C3 includes two rotatable silicon aluminum targets (83% silicon, 17% aluminum, by weight). The silicon aluminum targets are sputtered at a power level of about 38.6 kW in a sputtering atmosphere of 5 mTorr atmosphere with a gas flow 450 sccm/min argon and 451 sccm/min nitrogen. The substrate is moved past the silicon aluminum targets at a rate of about 60 inches per minute.

The functional coating 40 can be a single layer or a stack of layers. Various functional coatings can be used. In some cases, the functional coating 40 is a low-emissivity coating. The low-emissivity coating can be any low-emissivity coating known in the art. Low-emissivity coatings are well known in the art. Typically, they include one, two or three layers of infrared-reflection film and two or more layers of transparent dielectric film. The infrared-reflection film, which generally is a conductive metal like silver, gold, or copper, reduces the transmission of heat through the coating. The dielectric film is used to antireflect the infrared-reflection film and to control other properties and characteristics of the coating, such as color and durability. Commonly used dielectric materials include oxides of zinc, tin, indium, bismuth, and titanium, among others. In some embodiments, the low-emissivity coating 40 includes three or more infrared-reflective layers (e.g., silver-containing layers). Low-emissivity coatings with three or more infrared-reflective layers are described in U.S. patent application Ser. Nos. 11/546,152, 11/545,323, 11/545,231, 11/545,212, 11/545,211, 11/398,345, and 11/360,266, the salient teachings of each of which are incorporated herein by reference.

Figure 20:
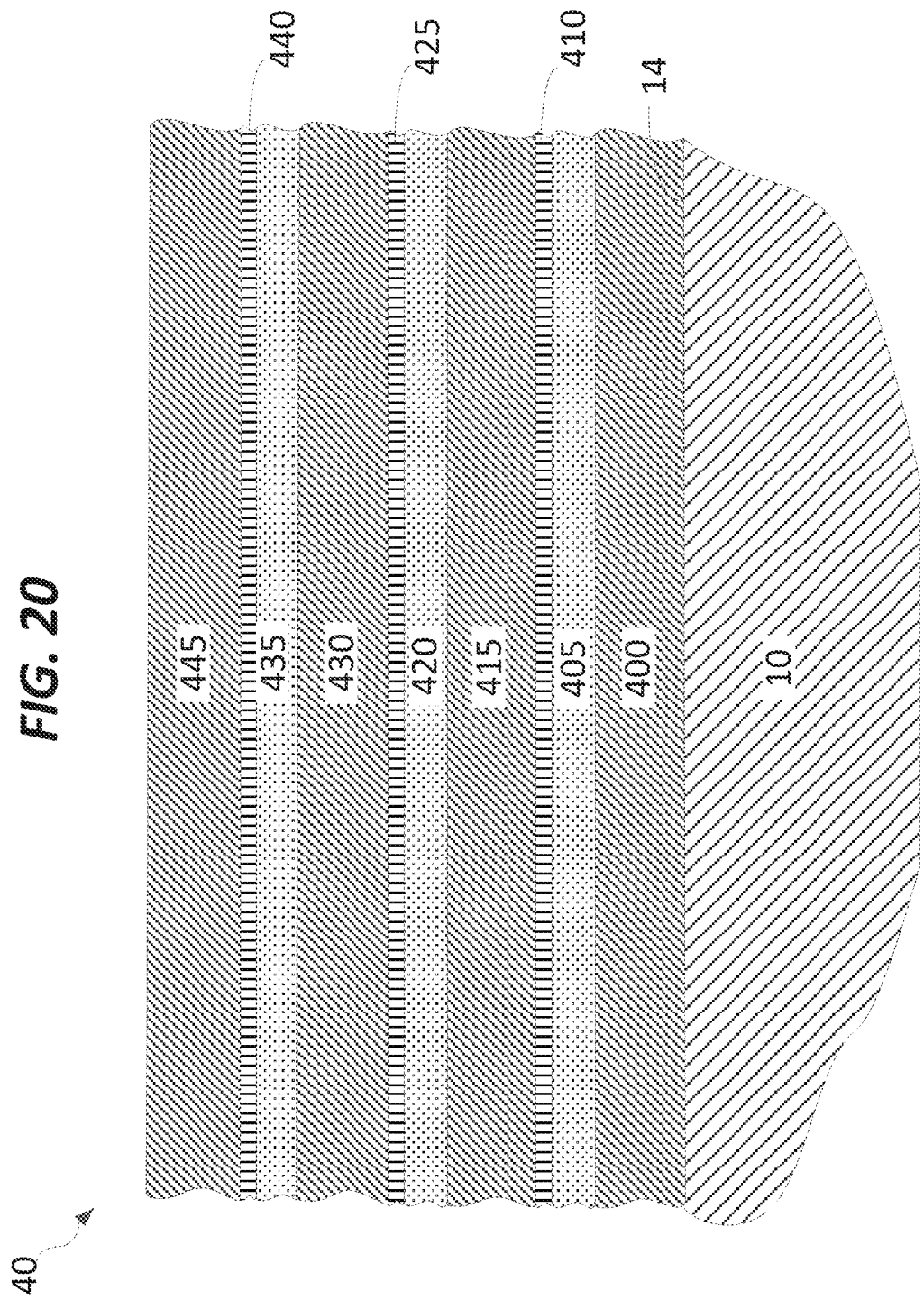
FIG. 20 is a schematic cross-sectional view of a substrate having the second surface carrying a low-emissivity coating in accordance with certain embodiments.

FIG. 20 illustrates an embodiment of a low-emissivity coating 40 according to certain embodiments. Generally, the low-emissivity coating 40 includes, in sequence from the exterior surface 14 outward, a first transparent dielectric film region 400, a first infrared-reflection film region 405, a second transparent dielectric film region 415, a second infrared-reflection film region 420, a third transparent dielectric film region 430, a third infrared-reflection film region 435, and a fourth transparent dielectric film region 445. In FIG. 20, optional blocker film regions 410, 425, 440 are shown, although these are not required in all embodiments.

The first transparent dielectric film region 400 is applied over (in some cases, directly over) an exterior surface 14 of the substrate 10. This film region 400 can be of any composition that includes at least some (or, optionally, consists essentially of) transparent dielectric film. In some cases, the first transparent dielectric film region 400 is a single layer. In other cases, it comprises a plurality of layers. As described in U.S. Pat. No. 5,296,302 (the teachings of which on useful dielectric materials are incorporated herein by reference), useful dielectric film materials for this purpose include oxides of zinc, tin, indium, bismuth, titanium, hafnium, zirconium, and alloys thereof. Film comprising silicon nitride and/or silicon oxynitride is also used in some embodiments.

The first transparent dielectric film region 400 can be a single layer of a single dielectric material. If a single layer is used, it is generally preferred that this inner dielectric layer be formed of a mixture of zinc oxide and tin oxide. It should be understood, though, that such a single layer can be replaced with two or more layers of different dielectric materials. In certain embodiments, the first transparent dielectric film region 400 comprises a graded thickness of film, having a composition that changes (e.g., in a gradual manner) with increasing distance from the substrate 10.

In some particular embodiments, the first transparent dielectric film region 400 comprises film (optionally comprising zinc oxide, such as a zinc tin oxide) having a refractive index of 1.7 or greater. For example, between the first infrared-reflection film region 400 and the surface 14 of the substrate 10, there can advantageously be provided a desired total thickness of film that has a refractive index of 1.7 or greater. In some cases, this desired total thickness is less than 195 angstroms, less than 190 angstroms, less than 175 angstroms, less than 165 angstroms, less than 145 angstroms, or even less than 140 angstroms.

Referring again to FIG. 20, the first infrared-reflection film region is identified by the reference number 405. This film region 405 preferably is contiguous to, i.e., in direct physical contact with, the outer face of the first transparent dielectric film region 400. Any suitable infrared reflection material can be used. Silver, gold, and copper, as well as alloys thereof, are the most commonly used infrared-reflection film materials. Preferably, the infrared-reflection film consists essentially of silver or silver combined with no more than about 5% of another metal, such as another metal selected from the group consisting of gold, platinum, and palladium. This, however, is by no means required.

When desired for protection of the infrared-reflection film during application of subsequent film and/or during any heat treatment (e.g., tempering), a first blocker film region 410 can optionally be provided over and contiguous to the first infrared-reflection film region 405. This blocker film region 410 can be provided to protect the underlying infrared-reflection film region 405 from chemical attack. In such cases, any material that is readily oxidized may be useful, as can any material that serves as a good barrier to oxygen. In certain embodiments, a thin layer of titanium metal is applied, and in some cases (e.g., cases where oxide film is reactively deposited directly over such a blocker film region) at least an outermost thickness of that titanium metal is converted to titanium oxide of varying stoichiometry during deposition of overlying film. In another embodiment, the blocker film region 410 is deposited as a layer of niobium. Useful blocker layers comprising niobium are discussed in detail in PCT International Publication No. WO 97/48649. The teachings of this PCT Publication relating to blocker layers are incorporated herein by reference.

In one group of embodiments, the coating 40 comprises three infrared-reflection film regions directly over at least one of which (and optionally over each of which) there is provided a blocker film region that is deposited in a non-metallic form (e.g., as a non-metallic material selected from the group consisting of an oxide, a nitride, and an oxynitride, including substoichiometric forms thereof). In this group of embodiments, the thickness for each such blocker film region can be within any one of the ranges noted herein for the optional blocker film regions. For example, exemplary thicknesses for the optional blocker film region generally range from 3-50 angstroms, such as 3-25 angstroms or 3-18 angstroms.

In certain preferred embodiments, the first blocker film region 405 has a particularly small thickness, such as less than 15 angstroms, less than 10 angstroms, less than 7 angstroms, less than 6 angstroms, or even less than 5 angstroms. While not shown in FIG. 20, a blocker film region can optionally be provided under the first infrared-reflection film region 405 as well.

The second transparent dielectric film region 415 is positioned between the first infrared-reflection film region 405 and the second infrared-reflection film region 420. Thus, the film region 415 can also be referred to as a "spacer" film region. This first spacer film region 415 can be a single layer of a single transparent dielectric material, or it can be a plurality of layers of different transparent dielectric materials. In some cases, the second transparent dielectric film region 415 comprises at least three transparent dielectric layers. Optionally, there are at least five, or even at least seven, such layers. As an alternative to using one or more discrete layers, part or all of the second transparent dielectric film region 415 can have a graded composition (optionally characterized by a gradual transition from one transparent dielectric material to another with increasing distance from the substrate).

The next illustrated film region is the second infrared-reflection film region 420. This film region 420 preferably is contiguous to the outer face of the second transparent dielectric film region 415. Any suitable infrared reflection material can be used, such as silver, gold, and copper, or alloys including one or more of these metals. In some particular embodiments, the infrared-reflection film consists essentially of silver or silver combined with no more than about 5% of another metal, such as another metal selected from the group consisting of gold, platinum, and palladium.

When desired for protection of the second infrared-reflection film region 420, a second blocker film region 425 can optionally be provided over and contiguous to the second infrared-reflection film region 420. This blocker film region 425 can comprise any material that is readily oxidized. In certain embodiments, a thin layer of titanium metal is applied, and in some cases (e.g., cases where oxide film is reactively deposited directly over this blocker film region 425) at least an outermost thickness of that titanium metal is converted to a titanium oxide of varying stoichiometry during deposition of overlying film. In another embodiment, the blocker film region 425 is deposited as a layer of niobium or one of the noted non-metallic blocker film materials.

Suitable thicknesses for the optional second blocker film region 425 generally range from 3-25 angstroms, or 3-18 angstroms. In certain embodiments, the second blocker film region 405 has a particularly small thickness, such as less than 15 angstroms, less than 10 angstroms, less than 7 angstroms, less than 6 angstroms, or even less than 5 angstroms. While not shown in FIG. 20, a blocker film region can optionally be provided under the second infrared-reflection film region 420 as well.

The third transparent dielectric film region 430 is positioned between the second infrared-reflection film region 420 and the third infrared-reflection film region 435. This transparent dielectric film region 430 is also a spacer film region, and can be referred to as the second spacer film region. The third transparent dielectric film region 430 can be a single layer of a single transparent dielectric material, or it can be a plurality of layers of different transparent dielectric materials. In some cases, the third transparent dielectric film region 430 comprises at least three transparent dielectric layers. Optionally, there are at least five, or even at least seven, such layers. As an alternative to one or more discrete layers, part or all of the third transparent dielectric film region 430 can have a graded composition.

The next illustrated film region is the third infrared-reflection film region 435. This film region 435 preferably is contiguous to the outer face of the third transparent dielectric film region 430. Any suitable infrared reflection material can be used (e.g., silver, gold, copper, or an alloy comprising one or more of these metals). In some particular embodiments, the third infrared-reflection film region 435 consists essentially of silver or silver combined with no more than about 5% of another metal, such as another metal selected from the group consisting of gold, platinum, and palladium.

When desired for protection of the third infrared-reflection film region 435, a third blocker film region 440 can optionally be provided over and contiguous to the third infrared-reflection film region 435. This blocker film region 440 can comprise any material that is readily oxidized. In certain embodiments, a thin layer of titanium metal is applied, and in some cases (e.g., cases where oxide film is reactively deposited directly over this blocker film region 440) at least an outermost thickness of that titanium metal is converted to a titanium oxide of varying stoichiometry during deposition of overlying film. In another embodiment, the blocker film region 405 is deposited as a layer of niobium or one of the noted non-metallic blocker film materials.

Suitable thicknesses for the optional third blocker film region 440 generally range from 3-25 angstroms, or 3-18 angstroms. In certain embodiments, the third blocker film region 440 has a particularly small thickness, such as less than 15 angstroms, less than 10 angstroms, less than 7 angstroms, less than 6 angstroms, or even less than 5 angstroms. While not shown in FIG. 20, a blocker film region can optionally be provided under the third infrared-reflection film region 435 as well.

Given the large number of blocker film regions provided in certain embodiments, it can be advantageous to use an exceptionally small thickness for one or more of the blocker film regions. Thus, in some embodiments, directly over at least one of the infrared-reflection film regions there is provided a blocker film region having a thickness of less than 7 angstroms, less than 6 angstroms, or even less than 5 angstroms. Further, in some embodiments, the coating 40 includes three blocker film regions 410, 425, 440, and the combined thickness of all three of these blocker film regions is less than 30 angstroms, less than 25 angstroms, less than 20 angstroms, less than 18 angstroms, or even less than 15 angstroms.

The fourth transparent dielectric film region 445 is located further from the substrate 10 than the third infrared-reflection film region 430. In some, though not all, embodiments, this film region 445 defines the coating's outermost face (which face can optionally be exposed, i.e., not covered by any other film or substrate). The fourth transparent dielectric film region 445 can be a single layer of a single transparent dielectric material, or it can be a plurality of layers of different transparent dielectric materials. In some cases, the fourth transparent dielectric film region 445 comprises at least three transparent dielectric layers. Optionally, there are at least five, or even at least seven, such layers. As an alternative to using one or more discrete layers, part or all of the fourth transparent dielectric film region 445 can have a graded composition.

Thus, it can be appreciated that the present coating 40 desirably includes at least four transparent dielectric film regions 400, 415, 430, 445. In some embodiments, the coating 40 comprises one or more, two or more, or even three or more nitride or oxynitride films, such as at least one, at least two, or even at least three films comprising silicon nitride and/or silicon oxynitride. In some embodiments of this nature, the coating 40 includes at least one nitride or oxynitride film (optionally comprising silicon nitride and/or silicon oxynitride) having a thickness of less than 150 angstroms, less than 140 angstroms, or even less than 125 angstroms, together with at least one other nitride or oxynitride film (optionally comprising silicon nitride and/or silicon oxynitride) having a thickness of greater than 50 angstroms, greater than 75 angstroms, greater than 100 angstroms, greater than 150 angstroms, or even greater than 175 angstroms. In some cases, the latter noted film is located either between the first 305 and second 320 infrared-reflection film regions or between the second 320 and third 335 infrared-reflection film regions. That is, it forms (or is part of) one of the spacer film regions.

Figure 21:
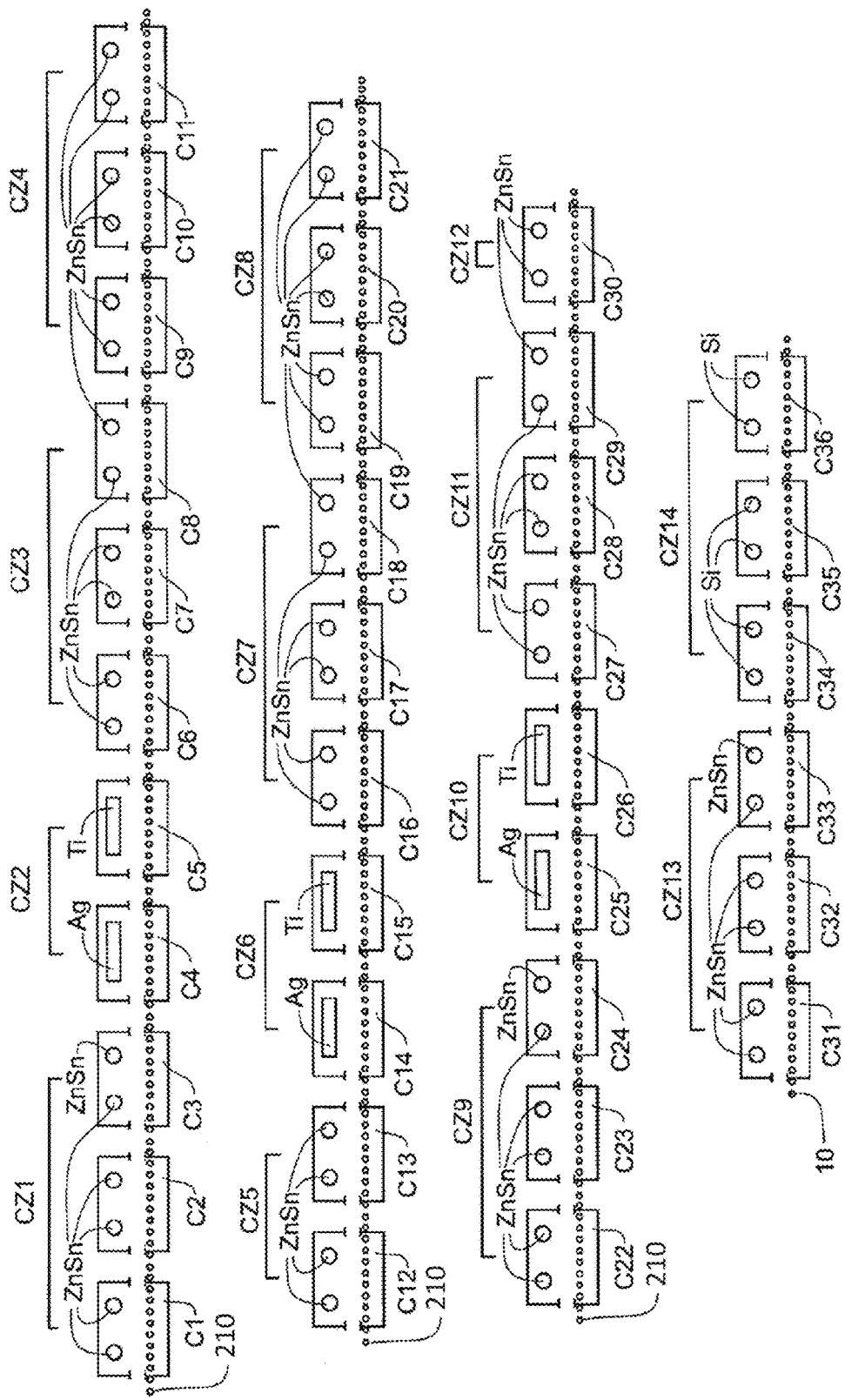
FIG. 21 is a schematic cross-sectional view of a coater for depositing a low-emissivity coating in accordance with certain embodiments.

Turning now to FIG. 21, there is depicted an exemplary coater for depositing a low-emissivity coating 40 in accordance with certain embodiments of the invention. The coater includes coat zones CZ1 through CZ14. In some cases, the coater 120 of FIG. 3 or 4 can include a coater as depicted in FIG. 21.

The coater shown in FIG. 21 is used to deposit a coating 40 that includes, in sequence from the interior surface 14 outward, a first transparent dielectric film region 400 comprising zinc tin oxide, a first infrared-reflection film region 405 comprising silver, a first blocker film region 410 comprising titanium, a second transparent dielectric film region 415 comprising zinc tin oxide, a second infrared-reflection film region 420 comprising silver, a second blocker film region 425 comprising titanium, a third transparent dielectric film region 430 comprising zinc tin oxide, a third infrared-reflection film region 435 comprising silver, a third blocker film region 440 comprising titanium, and a fourth transparent dielectric film region 445 that includes an outermost layer comprising silicon nitride over a layer comprising zinc tin oxide.

With continued reference to FIG. 21, the substrate 10 is positioned at the beginning of the coater and conveyed into the first coat zone CZ1 (e.g., by conveying the substrate along transport rollers 210). This coat zone CZ1 is provided with three sputtering chambers (or "bays"), C1 through C3, which are adapted collectively to deposit a first transparent dielectric film region 400 comprising zinc tin oxide. All three of these bays are provided with sputtering targets comprising a compound of zinc and tin. Each of these chambers is illustrated as having two cylindrical sputtering targets, although the number and type (e.g., cylindrical versus planar) can be varied as desired. These first six targets are sputtered in an oxidizing atmosphere to deposit the first transparent dielectric film region 400 in the form of an oxide film comprising zinc and tin. The oxidizing atmosphere here can consist essentially of oxygen (e.g., about 100% $O_2$) at a pressure of about $4 \times 10^{-3}$ mbar. Alternatively, this atmosphere may comprise argon and oxygen. A power of about 36.7 kW is applied to the first two targets, a power of about 34.6 kW is applied to the second two targets, and a power of about 35.5 kW is applied to the third two targets. The substrate 10 is conveyed beneath all six of these targets at a rate of about 310 inches per minute, while sputtering each target at the noted power level, thereby depositing the first transparent dielectric film region 400 in the form of an oxide film comprising zinc and tin and having a thickness of about 159 angstroms.

The substrate 10 is then conveyed into a second coat zone CZ2 wherein the first infrared-reflection film region 405 is applied directly over the first transparent dielectric film region 400. The second coat zone CZ2 is provided with an inert atmosphere (e.g., argon at a pressure of about $4 \times 10^{-3}$ mbar). The active sputtering chambers C4 and C5 of this coat zone CZ2 each have a planar target, although the number and type of targets can be changed. The target in chamber C4 is a metallic silver target, whereas the target in chamber C5 is a metallic titanium target. The substrate is conveyed beneath the silver target at a rate of about 310 inches per minute, while sputtering this target at a power of about 7.1 kW, thereby depositing the first infrared-reflection film region 405 in the form of a silver film having a thickness of about 122 angstroms. The substrate 10 is then conveyed beneath the titanium target in chamber C5, while sputtering this target at a power of about 7.8 kW, thereby depositing a first blocker film region 410 in the form of a film comprising titanium and having a thickness of about 4 angstroms.

The substrate 10 is then conveyed through a third coat zone CZ3, a fourth coat zone CZ4, and a fifth coat zone CZ5, in which zones the second transparent dielectric film region 415 is applied in the form of an oxide film comprising zinc and tin. The third CZ3 and fourth CZ4 coat zones each have three active sputtering chambers. The fifth coat zone CZ5 has two active sputtering chambers (there may be unused chambers and/or coat zones along the way). In each of the chambers C6-C13, there are mounted two cylindrical targets each comprising (i.e., including a sputterable target material comprising) a compound of zinc and tin. Each of these sputtering chambers C6-C13 is provided with an oxidizing atmosphere. For example, the oxidizing atmospheres in the third CZ3, fourth CZ4, and fifth CZ5 coat zones can each consist essentially of oxygen (e.g., about 100% $O_2$) at a pressure of about $4 \times 10^{-3}$ mbar. Alternatively, one or more of these atmospheres can comprise argon and oxygen.

A power of about 50.2 kW is applied to the first two targets in the third coat zone CZ3, a power of about 45.1 kW is applied to the second two targets in this coat zone CZ3, and a power of about 49.5 kW is applied to the third two targets in this zone CZ3. Here, a power of about 53.1 kW is applied to the first two targets in the fourth coat zone CZ4, a power of about 47.7 kW is applied to the second two targets in this coat zone CZ4, and a power of about 44.8 is applied to the third two targets in this zone CZ4. Further, a power of about 49.0 kW is applied to the first two targets in the fifth coat zone CZ5, and a power of about 45.6 kW is applied to the second two targets in this coat zone CZ5. The substrate 10 is conveyed beneath all of the noted targets in coat zones 3-5 (i.e., CZ3 through CZ5), while conveying the substrate at a rate of about 310 inches per minute and sputtering each target at the noted power level, such that the second transparent dielectric film region 415 is applied in the form of an oxide film comprising zinc and tin and having a thickness of about 562 angstroms.

The substrate 10 is then conveyed into a sixth coat zone CZ6 wherein the second infrared-reflection film region 420 is applied directly over the second transparent dielectric film region 415. The sixth coat zone CZ6 has an inert atmosphere (e.g., argon at a pressure of about $4 \times 10^{-3}$ mbar). The sputtering chambers C14, C15 in this coat zone CZ6 each have a planar target. The target in chamber C14 is a metallic silver target, and the target in chamber C15 is a metallic titanium target. A power of about 8.9 kW is applied to the silver target, while the substrate is conveyed beneath this target at a rate of about 310 inches per minute, to deposit the second infrared-reflection film region 420 as a metallic silver film having a thickness of about 149 angstroms. The substrate 10 is then conveyed (at the same speed) beneath the metallic titanium target in chamber C15, with a power of about 8.1 kW being applied to this target, to deposit a second blocker film region 425 comprising titanium and having a thickness of about 4 angstroms.

The substrate 10 is then conveyed through a seventh coat zone CZ7, an eighth coat zone CZ8, and a ninth coat zone CZ9, wherein collectively the third transparent dielectric film region 430 is applied. Each of these coat zones has three sputtering chambers, and each such chamber is provided with two cylindrical targets (chambers C16 through C18 are in CZ7, chambers C19 through C21 are in CZ8, and chambers C22 through C24 are in CZ9). The targets here all comprise a sputterable material that is a compound of zinc and tin. Each of these coat zones is provided with an oxidizing atmosphere consisting essentially of oxygen (e.g., about 100% $O_2$ at a pressure of about $4 \times 10^{-3}$ mbar). Alternatively, this atmosphere may comprise argon and oxygen.

A power of about 50.3 kW is applied to the first two targets in the seventh coat zone CZ7, a power of about 45.5 kW is applied to the second two targets in this coat zone CZ7, and a power of about 48.9 kW is applied to the third two targets in this zone CZ7. A power of about 52.5 kW is applied to the first two targets in the eighth coat zone CZ8, while a power of about 48.2 kW is applied to the second two targets in this coat zone CZ8, and a power of about 44.7 kW is applied to the third two targets in this zone CZ8. A power of about 49.0 kW is applied to the first two targets in the ninth coat zone CZ9, while a power of about 45.5 kW is applied to the second two targets in this coat zone CZ9, and a power of about 47.8 kW is applied to the third two targets in this zone CZ9. The substrate 10 is conveyed beneath all of these targets (i.e., beneath all of the targets in CZ7 through CZ9) at a rate of about 310 inches per minute, while sputtering each target at the noted power level, such that the third transparent dielectric film region 430 is applied as an oxide film comprising zinc and tin and having a thickness of about 655 angstroms.

The substrate 10 is then conveyed into a tenth coat zone CZ10 where the third infrared-reflection film region 435 is applied. This coat zone CZ10 contains an inert atmosphere (e.g., argon at a pressure of about $4 \times 10^{-3}$ mbar). The active chambers C25, C26 in this coat zone CZ10 are each provided with a planar target. The target in chamber C25 is a metallic silver target, and the target in chamber C26 is a metallic titanium target. A power of about 12.6 kW is applied to the silver target, while the substrate is conveyed beneath this target at a rate of about 310 inches per minute, thereby depositing the third infrared-reflection film region 435 as a silver film having a thickness of about 206 angstroms. The substrate is then conveyed beneath the titanium target in chamber C26, while sputtering that target at a power level of about 8.1 kW, so as to deposit a third blocker film region 440 in the form of a film comprising titanium and having a thickness of about 4 angstroms.

The substrate 10 is then conveyed through an eleventh coat zone CZ11, a twelfth coat zone CZ12, and a thirteenth coat zone CZ13, wherein collectively there is deposited an inner portion of the fourth transparent dielectric film region 445. The eleventh coat zone C11 has three sputtering chambers, each with two cylindrical targets (chambers C27 through C29 are in CZ11). The twelfth coat zone C12 has only one active sputtering chamber C30, and this chamber C30 is provided with two cylindrical targets. The thirteenth coat zone CZ13 has three sputtering chambers, each provided two cylindrical targets (chambers C31 through C33 are in CZ13). Each of the noted targets in coat zones CZ11 through CZ13 comprises a sputterable target material that is a compound of zinc and tin. The coat zones CZ11 through CZ13 are all provided with oxidizing atmospheres, each consisting essentially of oxygen (e.g., about 100% $O_2$ at a pressure of about $4 \times 10^{-3}$ mbar). Alternatively, one or more of these atmospheres can comprise argon and oxygen.

A power of about 17.9 kW is applied to the first two targets in the eleventh coat zone CZ11, a power of about 21.1 kW is applied to the second two targets in this coat zone CZ11, and a power of about 19.6 kW is applied to the third two targets in this zone CZ11. A power of about 20.1 kW is applied to the two targets in the twelfth coat zone CZ12. A power of about 21.5 kW is applied to the first two targets in the thirteenth coat zone CZ13, a power of about 19.4 kW is applied to the second two targets in this coat zone CZ13, and a power of about 19.3 kW is applied to the third two targets in this zone CZ13. The substrate 10 is conveyed beneath all of the noted targets in CZ11 through CZ13 at a rate of about 310 inches per minute, while sputtering each of these targets at the noted power level, such that an inner portion of the fourth transparent dielectric film region 445 is applied as an oxide film comprising zinc and tin and having at a thickness of about 236 angstroms.

Finally, the substrate 10 is conveyed into a fourteenth coat zone CZ14, wherein the outermost portion of the fourth transparent dielectric film region 445 is applied. This coat zone CZ14 has three sputtering chambers C34-C36, each containing a nitrogen atmosphere, optionally with some argon, at a pressure of about $4 \times 10^{-3}$ mbar. The sputtering chambers C34 through C36 in this coat zone CZ14 are each provided with two cylindrical targets. Each of these targets comprises a sputterable target material of silicon with a small amount of aluminum. A power of about 31.9 kW is applied to the first two targets in the fourteenth coat zone CZ14, a power of about 34.0 kW is applied to the second two targets in this coat zone CZ14, and a power of about 37.4 kW is applied to the third two targets in this zone CZ14. The substrate 10 is conveyed beneath all of the targets in CZ14 at a rate of about 310 inches per minute, while sputtering each of these targets at the noted power level, such that the outermost portion of the fourth transparent dielectric film region 440 is applied as a nitride film comprising silicon and a small amount of aluminum and having a thickness of about 101 angstroms.

While some preferred embodiments of the invention have been described, it should be understood that various changes, adaptations and modifications may be made therein without departing from the spirit of the invention and the scope of the appended claims.

The invention claimed is:

1. A method of depositing coating onto both sides of a substrate having a first surface and a second surface using a production line comprising a series of sputtering chambers and a plurality of transport rollers for conveying the substrate along the production line, the series of sputtering chambers comprising one or more upper targets positioned above the plurality of transport rollers and one or more lower targets positioned beneath the plurality of transport rollers, the method comprising;
    positioning the substrate on the production line such that the first surface is oriented toward said one or more upper targets and the second surface contacts two or more of the plurality of transport rollers;
    upwardly sputtering said one or more lower targets to deposit a sacrificial coating directly onto the second surface and downwardly sputtering said one or more upper targets to deposit a first functional coating onto the first surface;
    re-positioning the substrate on the production line such that the second surface is oriented toward said one or more upper targets and the first surface contacts two or more of the plurality of transport rollers, wherein the re-positioning occurs after depositing the first functional coating onto the first surface;
    removing the sacrificial coating from the second surface while leaving intact the first functional coating on the first surface; and
    downwardly sputtering said one or more upper targets to deposit a second functional coating onto the second surface after removing the sacrificial coating from the second surface.

2. The method according to claim 1 wherein the upwardly sputtering said one or more lower targets to deposit the sacrificial coating directly onto the second surface occurs before the downwardly sputtering said one or more upper targets to deposit the first functional coating onto the first surface.

3. The method according to claim 1 wherein the removing the sacrificial coating from the second surface while leaving intact the first functional coating on the first surface comprises removing the sacrificial coating from the second surface while not functionally altering the first functional coating.

4. The method according to claim 1 wherein the first functional coating provides the substrate with a surface roughness and the removing the sacrificial coating from the second surface while leaving intact the first functional coating on the first surface comprises removing the sacrificial coating from the second surface without changing the surface roughness by more than 10%.

5. The method according to claim 4 wherein the removing the sacrificial coating from the second surface while leaving intact the first functional coating on the first surface comprises removing the sacrificial coating from the second surface without changing the surface roughness by more than 5%.

6. The method according to claim 1 wherein the first functional coating provides the substrate with a sheet resistance and the removing the sacrificial coating from the second surface while leaving intact the first functional coating on the first surface comprises removing the sacrificial coating from the second surface without changing the sheet resistance by more than 10%.

7. The method according to claim 6 wherein the removing the sacrificial coating from the second surface while leaving intact the first functional coating on the first surface comprises removing the sacrificial coating from the second surface without changing the sheet resistance by more than 5%.

8. The method according to claim 1 wherein the first functional coating provides the substrate with a monolithic visible transmittance and the removing the sacrificial coating from the second surface while leaving intact the first functional coating on the first surface comprises removing the sacrificial coating from the second surface without changing the monolithic visible transmittance by more than 10%.

9. The method according to claim 8 wherein the removing the sacrificial coating from the second surface while leaving intact the first functional coating on the first surface comprises removing the sacrificial coating from the second surface without changing the monolithic visible transmittance by more than 5%.

10. The method according to claim 1 wherein the first functional coating provides the substrate with a haze level and the removing the sacrificial coating from the second surface while leaving intact the first functional coating on the first surface comprises removing the sacrificial coating from the second surface without changing the haze level by more than 10%.

11. The method according to claim 10 wherein the removing the sacrificial coating from the second surface while leaving intact the first functional coating on the first surface comprises removing the sacrificial coating from the second surface without changing the haze level by more than 5%.

12. The method according to claim 1 wherein the removing the sacrificial coating from the second surface while leaving intact the first functional coating on the first surface comprises removing the sacrificial coating from the second surface while not removing more than 10% of thickness of the first functional coating.

13. The method according to claim 1 wherein the first functional coating comprises a transparent conductive oxide coating, wherein the transparent conductive oxide coating includes a transparent conductive oxide film and an outer dielectric film, and wherein the removing the sacrificial coating from the second surface while leaving intact the first functional coating on the first surface comprises removing the sacrificial coating from the second surface while not removing any thickness of the transparent conductive oxide film.

14. The method according to claim 1 wherein the sacrificial coating has a thickness of less than 150 angstroms and the first functional coating has a thickness of at least 500 angstroms.

15. The method according to claim 1 wherein the first functional coating comprises a transparent conductive oxide coating, and the second functional coating is a low-emissivity coating comprising one or more silver layers.

16. The method according to claim 1 wherein the sacrificial coating consists of a single oxide film and the first functional coating consists of two or more layers each comprising oxide film, nitride film or oxynitride film.

17. The method according to claim 1 wherein the sacrificial coating is a single layer comprising zinc oxide.

18. The method according to claim 1 further comprising heat treating the substrate after downwardly sputtering said one or more upper targets to deposit the second functional coating onto the second surface.

19. The method according to claim 1 further comprising heat treating the substrate after removing the sacrificial coating from the second surface but before downwardly sputtering said one or more upper targets to deposit the second functional coating onto the second surface.

20. The method according to claim 1 wherein the removing the sacrificial coating from the second surface while leaving intact the first functional coating on the first surface comprises conveying the substrate through one or more washers to deposit a removal solution onto the second surface, such that the removal solution removes the sacrificial coating but does not remove the first functional coating.

21. The method according to claim 20 wherein the removing the sacrificial coating from the second surface while leaving intact the first functional coating on the first surface comprises conveying the substrate through a first washer to deposit a removal solution onto the second surface, such that the removal solution removes the sacrificial coating but does not remove the first functional coating, and then conveying the substrate through a second washer to deposit water and/or a washing solution onto the second surface, wherein the water and/or the washing solution removes the removal solution.

22. The method according to claim 20 wherein the removal solution has a pH in a range of less than 5 or greater than 9.

23. The method according to claim 20 wherein the removal solution removes the sacrificial coating at a rate of at least 2,000 angstroms per minute.

24. The method according to claim 1 wherein the removing the sacrificial coating from the second surface while leaving intact the first functional coating on the first surface comprises conveying the substrate through an etching chamber comprising one or more ion sources and etching the second surface with ions from the one or more ion sources to remove the sacrificial coating.

25. The method according to claim 1 wherein the step of re-positioning the substrate on the production line such that the second surface is oriented toward said one or more upper targets and the first surface contacts two or more of the plurality of transport rollers comprises flipping the substrate.

26. The method according to claim 1 wherein the step of re-positioning the substrate on the production line such that the second surface is oriented toward said one or more upper targets and the first surface contacts two or more of the plurality of transport rollers occurs after the step of removing the sacrificial coating from the second surface while leaving intact the first functional coating on the first surface.

27. The method according to claim 1 wherein the upwardly sputtering said one or more lower targets to deposit the sacrificial coating onto the second surface involves sputtering material upwardly between at least two of the plurality of transport rollers.

28. The method according to claim 1 wherein the production line comprises a first section and a second section, the plurality of transport rollers comprising a first series of transport rollers and a second series of transport rollers, the first section having the first series of transport rollers, at least one of the one or more upper targets, and at least one of the one or more lower targets, the second section having the second series of transport rollers and at least one of the one or more upper targets, wherein the sacrificial coating and the first functional coating are both deposited on the substrate while conveying the substrate along the first section of the production line, and the second functional coating is deposited on the substrate while conveying the substrate along the second section of the production line.

29. The method according to claim 28 wherein the first section and the second section of the production line are spaced apart, and the method includes removing the substrate from an end region of the first section, flipping the substrate, and moving the substrate to a front region of the second section.

\* \* \* \* \*